United States Patent
Wentzloff et al.

(10) Patent No.: US 10,567,154 B1
(45) Date of Patent: Feb. 18, 2020

(54) RING OSCILLATOR BASED ALL-DIGITAL BLUETOOTH LOW ENERGY TRANSMITTER

(71) Applicant: The Regents of The University of Michigan, Ann Arbor, MI (US)

(72) Inventors: David D. Wentzloff, Ann Arbor, MI (US); Xing Chen, Ann Arbor, MI (US)

(73) Assignee: THE REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 0 days.

(21) Appl. No.: 16/197,943

(22) Filed: Nov. 21, 2018

(51) Int. Cl.
| | |
|---|---|
| H04L 7/00 | (2006.01) |
| H04L 7/033 | (2006.01) |
| H03K 3/03 | (2006.01) |
| G04F 10/00 | (2006.01) |
| H03K 5/00 | (2006.01) |
| H03F 3/19 | (2006.01) |
| H03F 3/24 | (2006.01) |

(Continued)

(52) U.S. Cl.
CPC .......... H04L 7/0331 (2013.01); G04F 10/005 (2013.01); H03F 3/19 (2013.01); H03F 3/245 (2013.01); H03K 3/0315 (2013.01); H03K 5/00006 (2013.01); H03L 7/0995 (2013.01); H04B 1/04 (2013.01); *H03F 2200/451* (2013.01)

(58) Field of Classification Search
CPC ......... H04L 7/0331; H03F 3/19; H03F 3/245; H03K 3/0315; H03K 5/00006; H03L 7/0995; H04B 1/04
See application file for complete search history.

(56) References Cited

U.S. PATENT DOCUMENTS

| | | | |
|---|---|---|---|
| 5,382,921 A | * | 1/1995 | Estrada ............... H03K 3/0315 327/159 |
| 7,702,032 B2 | | 4/2010 | Boos |
| 8,301,098 B2 | | 10/2012 | Uehara et al. |

(Continued)

FOREIGN PATENT DOCUMENTS

| | | |
|---|---|---|
| WO | WO-2017184396 A1 | 10/2017 |
| WO | WO-2018048596 A2 | 3/2018 |
| WO | WO-2018048916 A1 | 3/2018 |

*Primary Examiner* — Curtis B Odom
(74) *Attorney, Agent, or Firm* — Harness, Dickey & Pierce, P.L.C.

(57) ABSTRACT

A Bluetooth Low-Energy (BLE) transmitter is presented for used in ultra-low-power radios in short range IoT applications. The power consumption of state-of-the-art BLE transmitter has been limited by the relatively power-hungry local oscillator due to the use of LC oscillators for superior phase noise performance. This disclosure addresses this issue by analyzing the phase noise limit of a BLE TX and proposes a ring oscillator-based solution for power and cost savings. The proposed transmitter features: 1) a wideband all-digital phase locked loop (ADPLL) featuring an $f_{RF}/4$ RO, with an embedded 5-bit TDC; 2) a 4× frequency edge combiner to generate the 2.4 GHz signal; and 3) a switch-capacitor digital PA optimized for high efficiency at low transmit power levels. These not only help reduce the power consumption and improve phase noise performance, but also enhance the transmitter efficiency for short range applications.

20 Claims, 23 Drawing Sheets

(51) Int. Cl.
*H04B 1/04* (2006.01)
*H03L 7/099* (2006.01)

(56) References Cited

U.S. PATENT DOCUMENTS

| | | | |
|---|---|---|---|
| 9,819,356 B2 | 11/2017 | Ponton et al. | |
| 2007/0152763 A1* | 7/2007 | Mansuri | H03L 7/0995 |
| | | | 331/57 |
| 2009/0203399 A1 | 8/2009 | Rofougaran et al. | |
| 2013/0287065 A1* | 10/2013 | Sun | H03C 3/0941 |
| | | | 375/146 |
| 2015/0249431 A1* | 9/2015 | Kumagawa | H03F 3/2178 |
| | | | 330/251 |
| 2015/0295562 A1 | 10/2015 | Agarwal et al. | |
| 2016/0269035 A1* | 9/2016 | Wentzloff | H03L 7/087 |
| 2017/0373892 A1 | 12/2017 | Ganesan et al. | |

\* cited by examiner

RING OSCILLATOR BASED ALL-DIGITAL BLUETOOTH LOW ENERGY TRANSMITTER

GOVERNMENT CLAUSE

This invention was made with government support under EEC-1160483 awarded by the National Science Foundation. The government has certain rights in the invention.

FIELD

The present disclosure relates to an ultra-low power Bluetooth transmitter with an all-digital phase-locked loop circuit.

BACKGROUND

Because of its versatility and practicality, Bluetooth Low-Energy (BLE) is becoming more popular as the wireless communication protocol for Internet-of-Things (IoT) applications. The recently finalized Bluetooth 5.0 standard enables a faster data rate, more versatile advertising channel interactions, and a more flexible communication range, which makes BLE radios more adaptive in IoT designs. However, state-of-the-art BLE designs still consume an average of 4-5 mW active power while commercial BLE SoCs consume more than 10 mW, limiting battery life ad placing a ceiling on the adoption of IoT devices. In applications that require extended battery life or self-powered operation via energy harvesting such as wireless body sensor networks (WBSN), implantable medical devices, and replaceable consuming electronics, BLE radios consume too much power to be adopted at a large scale. In such systems, ultra-low-power (ULP) radios with proprietary asymmetrical communication protocols are used to save power in the edge nodes while pushing all the computation and power into the base station. But these designs either suffer from a significantly lower data rate, more severe interference and multiple access issues, or an extra bulky aggregator. Thus, it's very beneficial to explore a way to further reduce the BLE radio's power consumption, especially the BLE transmitter (TX), and enable a standard compatible asymmetrical communication with a sub-Mw BLE TX in the edge-nodes and fully compliant BLE transceivers in a cellphone or tablet as the base station. It will not only save a significant amount of power and extend the lifetime of IoT state-of charge (SoCs), but could also help resolve the interference and base station issues in ULP wireless systems.

The bottleneck of further power reduction in BLE TX design mainly results from two building blocks: the local oscillator (LO) and the power amplifier (PA), which take more than 80% of the transmitter power consumption combined. Significant effort has been done in the phase-locked loop (PLL) design for BLE. And some state-of-the-art ADPLL designs have successfully broke through the 1 mW barrier. But due to the use of LC voltage-controlled oscillators (LCVCO) with quality factors <20, it is hard to reduce power any further, no matter the performance. A recent trend shows that more and more BLE designs prefer to use open-loop LCVCO designs with direct modulation, since its phase noise (PN) performance is more than enough for BLE. In normal cases, the LO PN requirement for a BLE TRX is determined by the receiver (RX) side due to the requirements in RX sensitivity, blockers, and reciprocal mixing, and it's always better to have a better phase noise. But for a BLE TX-only prioritized design, the phase noise limit for the local oscillator has not been defined yet. This is especially true if this transmitter is in an asymmetric network where the RX LO in the "base-station" is often overprovisioned with high phase noise tolerance. This disclosure will address this issue by giving a detailed analysis between phase noise and system level specifications for a transmitter. The relaxed phase noise limit for BLE TX will not only help bring down the transmitter power consumption to its physical limit, but also increases flexibility in BLE circuit design based on the application emphasis.

This section provides background information related to the present disclosure which is not necessarily prior art.

SUMMARY

This section provides a general summary of the disclosure, and is not a comprehensive disclosure of its full scope or all of its features.

An improved frequency synthesizer is presented. The frequency synthesizer includes: a modulation controller, a phase-locked loop circuit and a frequency multiplier circuit. The modulation controller is configured to receive a reference signal from a reference source and operates to frequency modulate the reference signal in accordance with a frequency control word. The phase-locked loop circuit is interfaced with the modulation controller to receive a frequency modulated input signal. The phase-locked loop circuit includes a ring oscillator with an embedded time-to-digital converter circuit. The frequency multiplier circuit is configured to receive a frequency modulated output signal from the phase-locked loop circuit and increase frequency of the frequency modulated output signal by a multiplier. The frequency multiplier circuit can be further defined as a windowed edge combiner. The frequency synthesizer is particularly suited for used in a wireless transmitter.

In some embodiments, the time-to-digital converter circuit directly samples phases of the ring oscillator without delay lines.

In some embodiment, the phase-locked loop circuit includes a digital-to-analog converter coupled to an input of the ring oscillator and operates to tune frequency of the ring oscillator. The digital-to-analog converter may include a coarse tuning bank comprised of one or more transistors biased on in a linear region and a fine tuning bank comprised of one or more transistors only biased in a saturation region.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1A:
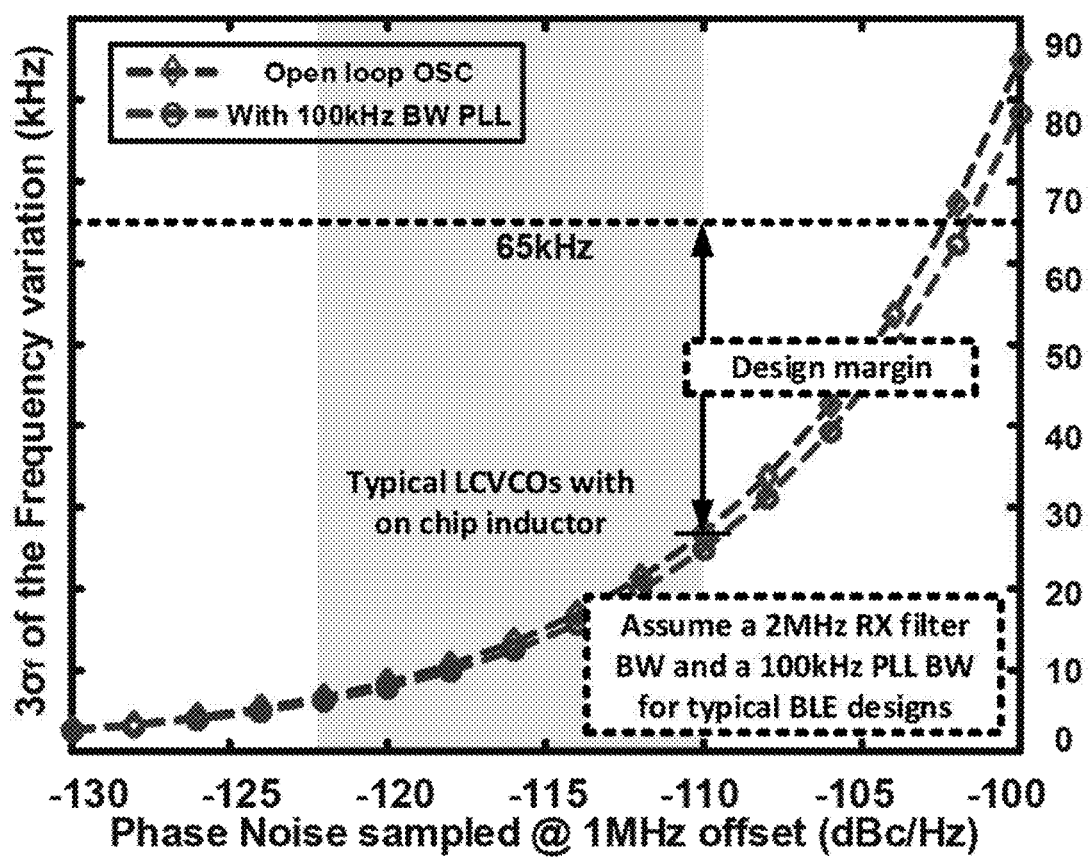
FIG. 1A is a graph showing simulated LO phase noise vs IFV in an open-loop oscillator compared to typical small bandwidth PLL.

Example embodiments will now be described more fully with reference to the accompanying drawings.

The relationship among phase noise, period jitter and instantaneous frequency variation has been well analyzed in various works. Frequency error of an LO can be roughly calculated based on the integrated PN. Since BLE is frequency modulated, it is beneficial to derive an intuitive relationship to link circuit level specs such as phase noise, and system level specs such as frequency deviation, modulation index, etc.

In a high SNR regime where the target communication range is within 1-2 meters, phase noise is the dominant noise source. Flicker noise will contribute more in the slow frequency drift, so its effect in random jitter and instantaneous frequency variation (IFV) is negligible in this analysis. The mean squared value of period jitter and IFV is given by $$\sigma_f^2 = f_0^4 \sigma_\tau^2 \quad (1)$$

where $\sigma_f$, $\sigma_\tau$ represent the standard deviation of IFV and jitter, and $f_0$ is the center frequency. Using the Wiener-Khinchine theorem, one can calculate the mean squared jitter from the spectral density:

$$\sigma_\tau^2 = \int_0^\infty S_\tau(f) df = \frac{1}{f_0^4} \int_0^\infty S_\phi(f) f^2 \mathrm{sinc}^2\left(\frac{\pi f}{f_0}\right) df \quad (2)$$

where $S_\tau(f)$ and $S_\phi(f)$ are the power spectral densities (PSDs) of jitter and random phase, respectively. It can be further simplified as:

$$\sigma_\tau^2 = \frac{2}{\pi f_0^3} \int_0^\infty \mathcal{L}(f) f^2 \, df \int_0^\infty \mathrm{sinc}^2(x) \, dx \quad (3)$$

where $\mathcal{L}(f)$ is the PN PSD and with only white noise taken into consideration, $\mathcal{L}(f)f^2$ is a constant. Thus, across the whole single side band (SSB), the relation among period jitter, IFV and PN can be simplified as:

$$\sigma_\tau^2 = \frac{1}{f_0^3} \mathcal{L}(f) f^2 \quad (4)$$

$$\sigma_f^2 = f_0 \mathcal{L}(f) f^2 \quad (5)$$

This is the classical link between jitter and PN, with a relation to IFV when noise in the whole SSB is considered. However, when it comes to the phase noise impact in radio circuit designs, one needs to consider the noise filtering effect in the receiver. Assuming a brick wall filter in the RX with a bandwidth $BW_{rx}$:

$$\sigma_\tau^2 = \frac{2}{\pi f_0^3} \mathcal{L}(f) f^2 \int_0^{\frac{BW_{rx}\pi}{f_0}} \mathrm{sinc}^2(x) \, dx \quad (6)$$

Since the RX bandwidth is much smaller than the carrier frequency, the integral of the squared sinc function can be approximated as:

$$\int_0^{\frac{BW_{rx}\pi}{f_0}} \mathrm{sinc}^2(x) \, dx \approx Si\left(\frac{2BW_{rx}\pi}{f_0}\right) \approx \frac{2BW_{rx}\pi}{f_0} \quad (7)$$

Thus, with the RX filter, the relation among jitter, PN and IFV can be modified as:

$$\sigma_\tau^2 = \frac{4BW_{rx}\pi}{f_0^4} \mathcal{L}(f) f^2 \quad (8)$$

$$\sigma_f^2 = 4BW_{rx}\mathcal{L}(f) f^2 \quad (9)$$

This offers a simple intuition for circuit designers that once the RX filter BW is known, the PN spec at certain offset, say 1 MHz, can be calculated directly from the system level requirements for the frequency modulated signal.

Next, consider the case where a PLL affects the PN noise shaping. When the PLL has a bandwidth $BW_{pll}$, and with all the PLL noise sources taken into account, the in-band PN can be approximated as a constant $\mathcal{L}_{in}$. So (2) becomes:

$$\sigma_\tau^2 = \frac{2\mathcal{L}_{in}}{f_0^4} \int_0^{BW_{pll}} \frac{f_0^2}{\pi^2} \sin^2\left(\frac{\pi f}{f_0}\right) df + \frac{2\mathcal{L}_{in} f_{BW_{pll}}^2}{f_0^4} \int_{BW_{pll}}^{BW_{rx}} \mathrm{sinc}^2\left(\frac{\pi f}{f_0}\right) df \quad (10)$$

Simplified as:

$$\sigma_\tau^2 = \left\{ \begin{array}{l} \frac{1}{2\pi^3 f_0}\left(\frac{2\pi BW_{pll}}{f_0} - \sin\left(\frac{2\pi BW_{pll}}{f_0}\right)\right) + \\ \frac{4}{f_0^4}(BW_{rx} - BW_{pll})BW_{pll}^2 \end{array} \right\} \mathcal{L}_{in} \quad (11)$$

$$\sigma_f^2 = \left\{ \begin{array}{l} \frac{f_0^3}{2\pi^3}\left(\frac{2\pi BW_{pll}}{f_0} - \sin\left(\frac{2\pi BW_{pll}}{f_0}\right)\right) + \\ 4(BW_{rx} - BW_{pll})BW_{pll}^2 \end{array} \right\} \mathcal{L}_{in} \quad (12)$$

Note that (11) and (12) show that the larger the PLL bandwidth, the larger the jitter and IFV. That is because in these equations, the in-band phase noise is set as a constant, and larger BW means a higher oscillator PN. On the other hand, larger BW means lower $L_{in}$ if the oscillator PN is preset. In PLL designs, the in-band PN is a more valuable spec than the oscillator spot PN at certain offset, since it also defines specs for other circuit blocks, which are also major PLL noise sources such as the reference, divider, TDC, and DAC, etc. For the $BW_{rx} < BW_{pll}$ case, the PH, jitter and IFV relations are shown as follows:

$$\sigma_\tau^2 = \frac{1}{2\pi^3 f_0}\left(\frac{2\pi BW_{rx}}{f_0} - \sin\left(\frac{2\pi BW_{rx}}{f_0}\right)\right) \mathcal{L}_{in} \quad (13)$$

$$\sigma_f^2 = \frac{f_0^3}{2\pi^3}\left(\frac{2\pi BW_{rx}}{f_0} - \sin\left(\frac{2\pi BW_{rx}}{f_0}\right)\right) \mathcal{L}_{in} \quad (14)$$

This case is very useful for RO based designs where RO PN is the dominant noise source for PLL design and it needs to be regulated with a wide PLL bandwidth.

Figure 1B:
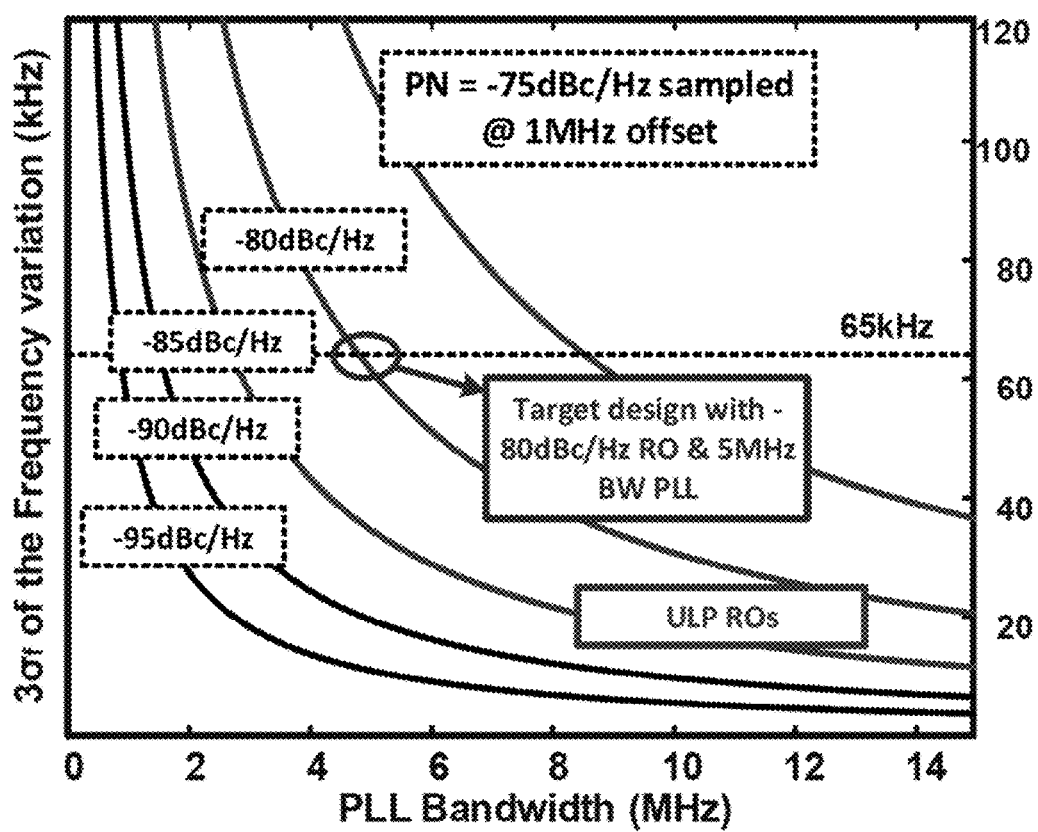
FIG. 1B is a graph showing a PLL bandwidth requirement for different phase noise levels.

The above derivations show the relationship among PN, jitter, and IFV. Even though seemingly more complicated than the simple integral format, it offers a more intuitive link between spot/in-band PN to a system level spec in frequency modulated radios. This is because the $6\sigma_f$ of the IFV is approximately the peak-to-peak frequency error, and spot/in-band PN is a direct indicator of oscillator/PLL design. For example, as shown in FIG. 1A, BLE requires a >370 kHz minimum frequency difference for a ±250 k frequency deviation. Therefore a $3\sigma_f < 65$ kHz can be used to define the PN spec (40 kHz for GFSK but in the noise limited region, Gaussian shaping won't effectively improve the spectrum efficiency). Comparing the open loop oscillator and PLL regulated case when the PLL BW and RX BW are set to 100 kHz and 2 MHz, FIG. 1A shows that the resulting IFV is comparable and leaves a big margin to the 65 kHz BLE requirement using LCVCO, which indicates an over-design in the LO noise-power penalty. FIG. 1B further shows that with a wide band PLL to suppress the in-band PN, an ULP RO could also achieve the target. This disclosure proposes to utilize a −80 dBc/Hz RO @ 1 MHz offset with a 4 MHz bandwidth PLL to verify the above analysis.

In order to achieve the target PN using a noisy RO rather than the generally used LCVCO, the PLL design for the BLE transmitter is critical. Even though the major noise source is the VCO PN, other building blocks also need to be carefully dealt with, especially for low power designs. FIGS. 2A-2D show four different architectures of the TDC based DPLLs. The divider based ADPLL shown in FIG. 2A needs a relatively high power divider and suffers from divider noise folding as well as reference noise up-conversion. For fractional operation, an extra Delta-Sigma Modulator (DSM) is needed for the divider. Thus, this is a relatively power hungry choice. The divider-less ADPLL shown in FIG. 2B removes the divider and directly uses a TDC to generate the fractional error. This architecture removes the noise contributed from the divider and the DSM, but a TDC running at RF frequency consumes a significant amount of power, let alone an extra normalization circuit. Advanced designs in this architecture effectively reduce the TDC power consumption by introducing a DTC and snapshot circuit, but the timing misalignment and non-linearity of the DTC and TDC will introduce spurs. The pre-calibration circuit will result in extra power consumption too. As for the architecture shown in FIG. 2C with an embedded TDC, the power is saved by removing the removing the divider, TDC and the normalization circuit. However, the TDC resolution is severely limited by the number of RO stages at high frequency, which will result in a high in-band phase noise.

Figure 2A:
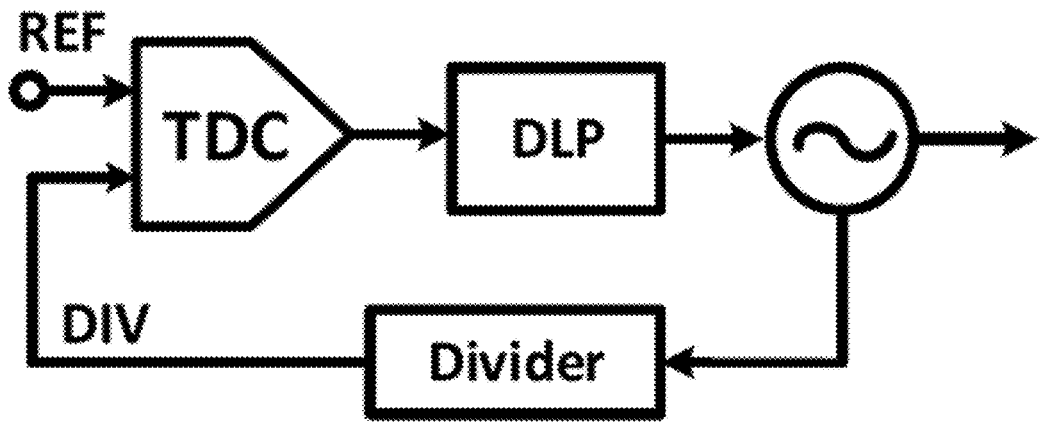
FIG. 2A is a simplified block diagram showing a divider based ADPLL with TDC as the PD.
Figure 2B:
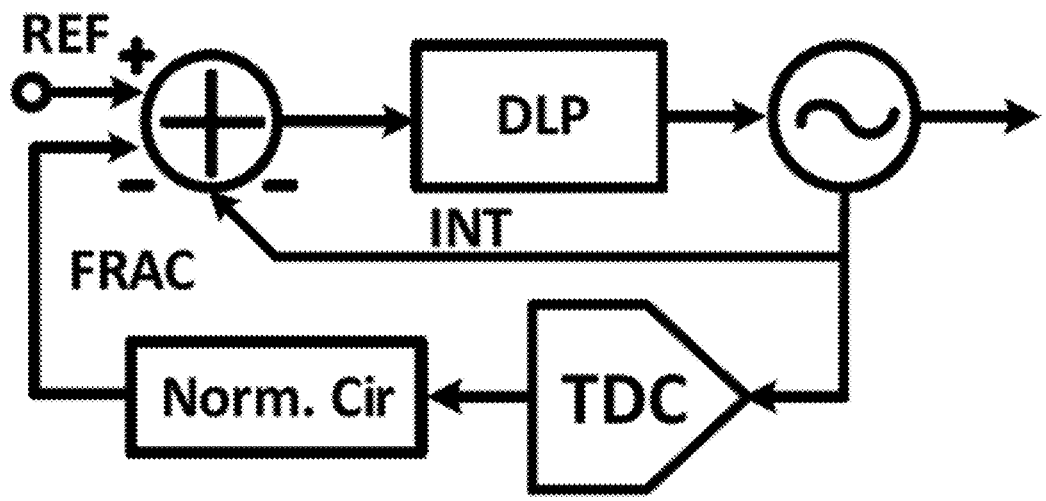
FIG. 2B is a simplified block diagram showing a divider-less ADPLL with TDC.
Figure 2C:
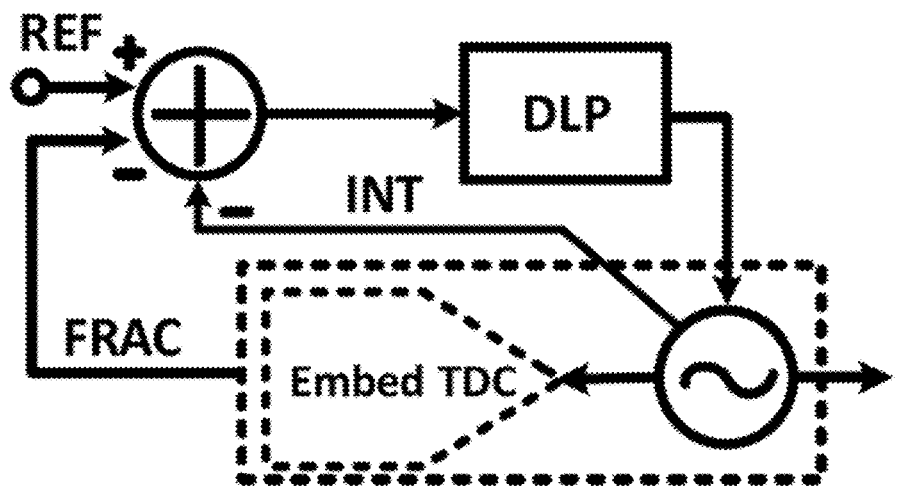
FIG. 2C is a simplified block diagram showing a divider-less ADPLL with embedded TDC.
Figure 2D:
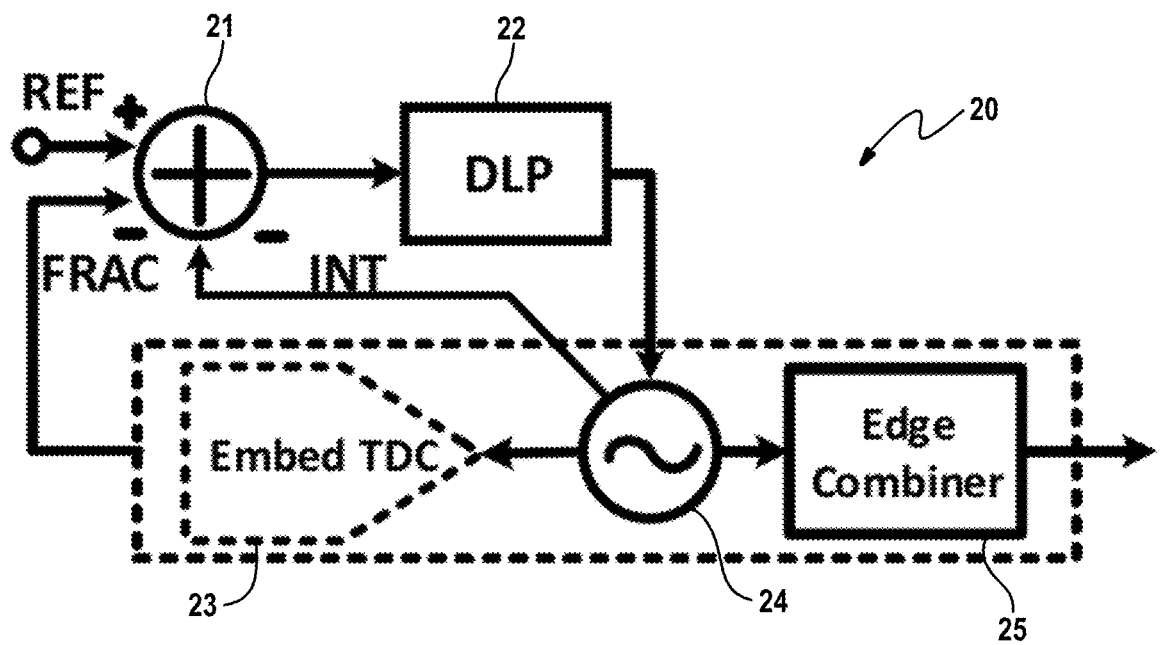
FIG. 2D is a simplified block diagram showing a proposed ADPLL with quarter frequency OSC and 4× edge combiner.

FIG. 2D shows the simplified block diagram of a proposed all-digital phase-locker loop (ADPLL) 20 to address the above issues. The ADPLL 20 is comprised of a voltage-controlled oscillator 24, an embedded time-to-digital converter 23, a phase comparator 21 and a low pass filter 22. In an example embodiment, the voltage-controlled oscillator 24 includes a ring oscillator. As is commonly understood, embedded means the TDC circuit 23 directly samples phase of the ring oscillator without delay lines. The ADPLL 20 also includes a frequency multiplier circuit 25 configured to receive output from the phase-locked loop circuit and increase frequency of the output signal by a multiplier. In one example, the frequency multiplier circuit 25 is further defined as a windowed edge combiner.

Figure 3:
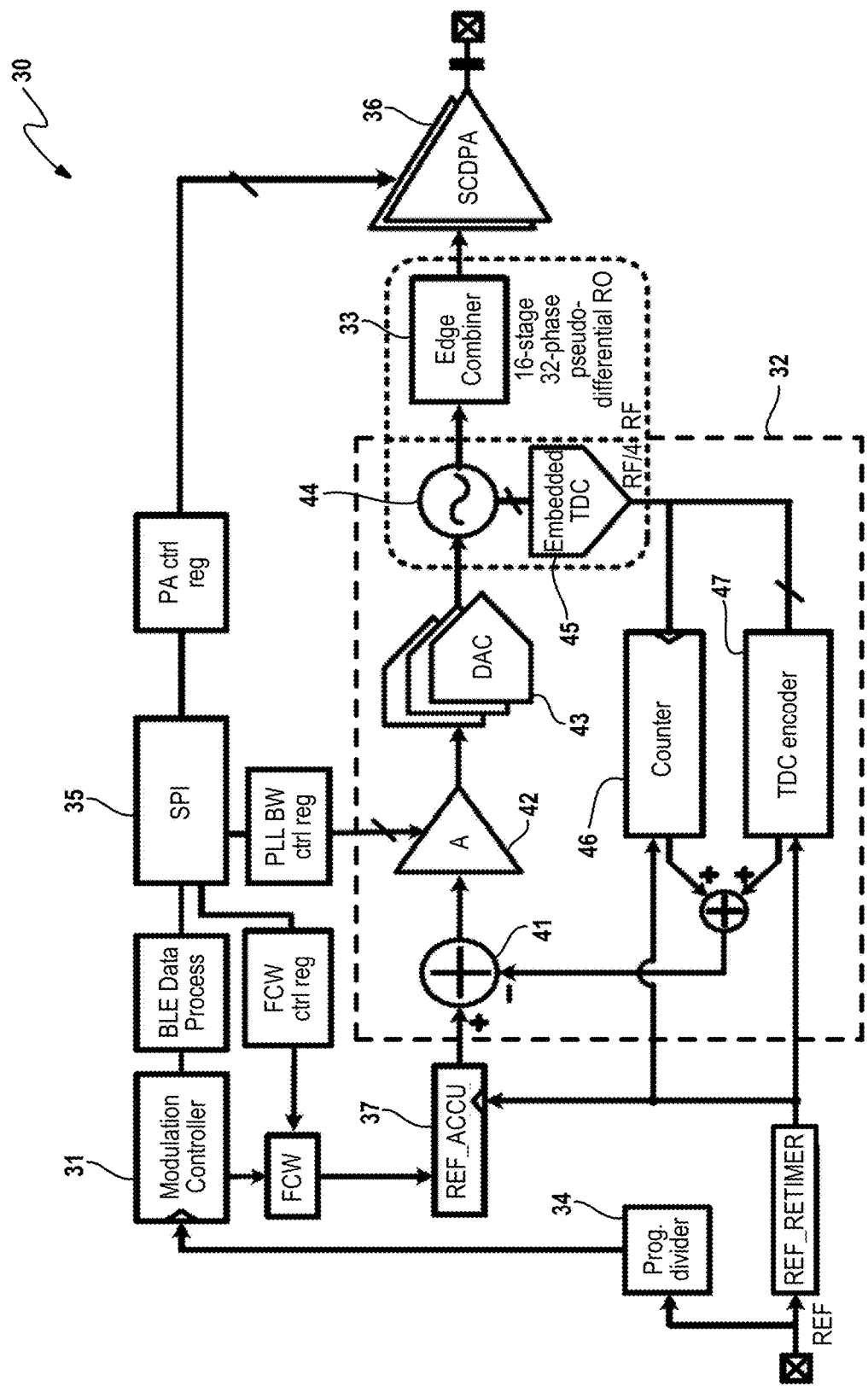
FIG. 3 is a block diagram of an example embodiment of a frequency synthesizer incorporating the proposed ADPLL.

FIG. 3 further illustrates an example embodiment of a frequency synthesizer 30 with the proposed ADPLL. The frequency synthesizer 30 is comprised of a modulation controller 31, a phase-locked loop circuit 32 and a frequency multiplier circuit 33. The modulation controller 31 is configured to receive a reference signal from a reference source and operates to frequency modulate the reference signal in accordance with a frequency control word that is associated with the baseband data. The reference signal may be received via a programmable divider 34 from the reference source. The modulation controller 31 is interfaced via a serial peripheral interface (SPI) 35 with a digital gain block 42 to control loop gain of the phase-locked loop circuit 32 as well as interfaced with the switched capacitor digital amplifier 36 to control its power gain.

In this example embodiment, the phase-locked loop circuit 32 includes a phase comparator 41, a digital gain block (e.g., type I loop filter) 42, a digital-to-analog converter 43, and a ring oscillator 44 with an embedded time-to-digital converter 45. A reference phase accumulator 37 provide the input to the phase-locked loop circuit 32, and a counter 46 and TDC encoder complete the loop of the phase-locked loop circuit 32. While a particular arrangement has been described, other implementations are also contemplated for the phase-locked loop circuit.

To achieve the targeted frequency variation error with the ring oscillator 44, a 5 MHz bandwidth ADPLL for aggressive in-band phase noise suppression is implemented. It features a fast settling time and direct reference phase modulation at the frequency control word (FCW) since the PLL BW is much larger than the modulation bandwidth. The bandwidth is programmable by changing the loop filter gain through the SPI interface 35. Several techniques are used to save the PLL power and enhance its in-band phase noise at the same time. In the example embodiment, the ring oscillator 44 is designed at a frequency of $f_{RF}/4$ and implemented with a 16-stage pseudo-differential architecture with 32 phases directly used as an embedded TDC. Its phases are also used in a windowed edge combiner 33 (EC) for 4× frequency multiplication to produce the 2.4 GHz RF frequency. The lower frequency ring oscillator 44 saves the power of the frequency divider. It also prevents the noise folding effect from happening in the divider based PLL, thus improving in-band phase noise performance.

At the same time, the high power TDC 45 and its delay normalization circuits are also saved, and the TDC performance can be relaxed by dealing with the same amount of jitter at a lower frequency while maintaining the same resolution. The edge combiner 33 consumes much less power compared to a TDC, and it can maintain the low flicker noise corner from the low frequency ring oscillator 44, which will again, enhance the in-band phase noise. However, extra deterministic jitter will be introduced because of the mismatches in the different paths of the edge combiner, as modeled in FIG. 4. And due to periodical phase shifts, the edge combiner will also introduce spurs at $\pm f_{RF}/4$ off the center frequency. Its negative effect will be analyzed in more detail below.

Figure 4:
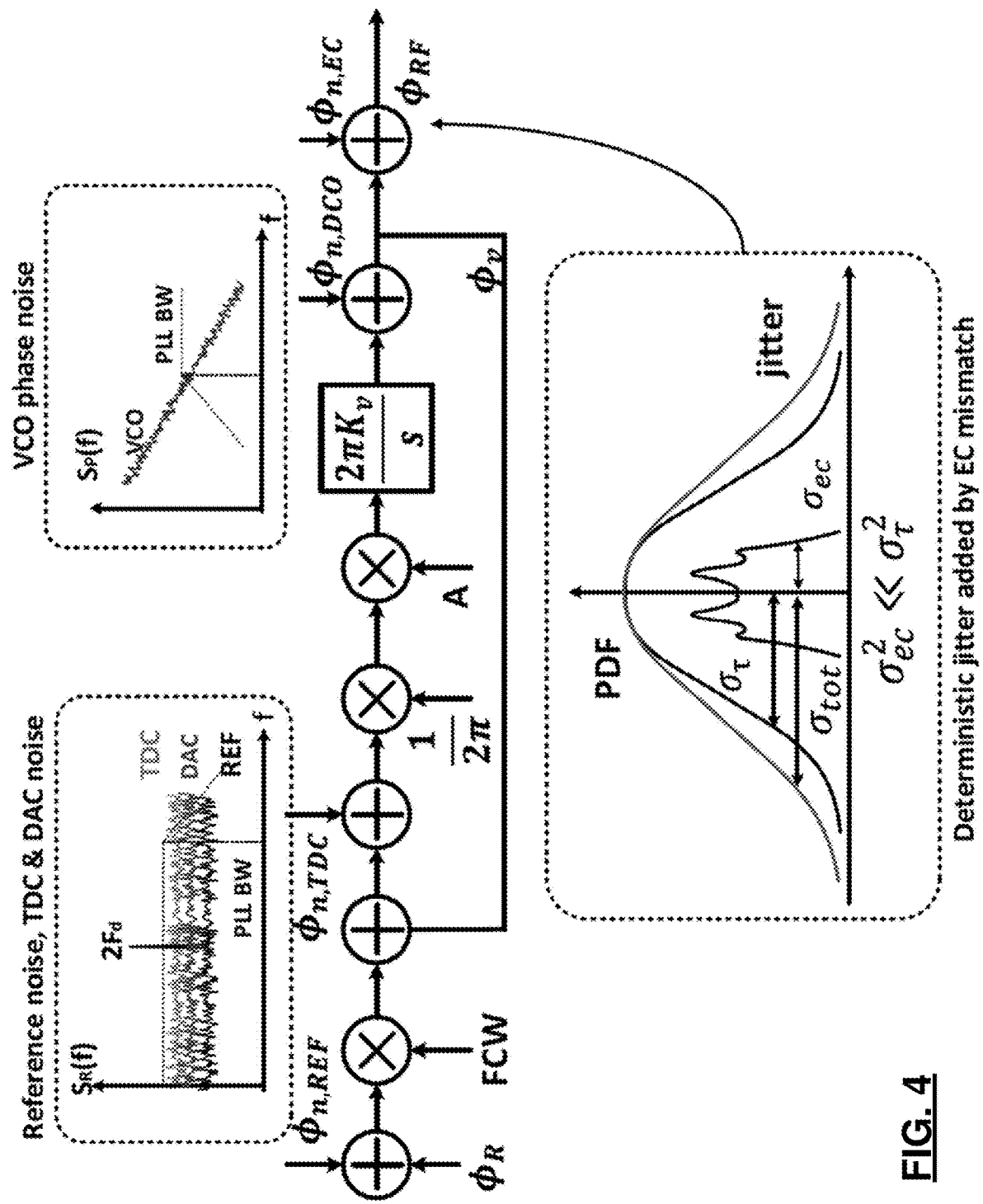
FIG. 4 is a diagram of a system level noise analysis with different noise sources including reference noise, TDC noise, DAC noise, VCO noise and EC noise.
Figure 5A:
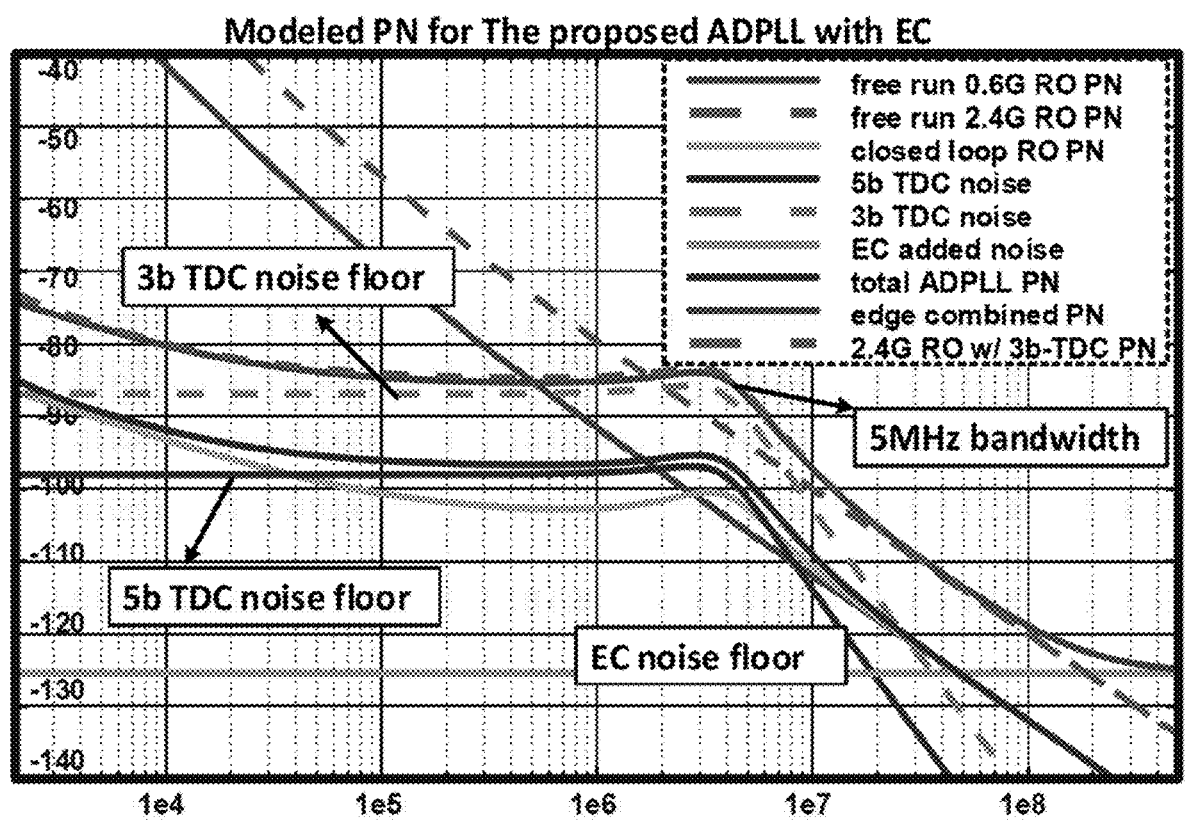
FIG. 5A is a graph showing noise performance of the proposed ADPLL showing modeled with different phase noise sources.

Referring to FIG. 4, major noise sources are modelled for the PLL, including reference noise, TDC noise, DAC noise and RO phase noise. The PLL is designed to achieve a 5 MHz BW with a −85 dBc/Hz in-band PN after edge combining. In this design, the in-band PN is dominated by both the RO and TDC. Due to the extended TDC bits, the TDC noise floor is around −100 dBc/Hz, which is comparable to the in-band PN of the quarter frequency RO, as shown in FIG. 5A. Ideally, the relative noise floor difference between RO and TDC are the same with or without the quadruple effect. However, since the absolute delay offset due to layout mismatch, loading variation and RO jitter are the same, the actual TDC noise floor is slightly enhanced in the quarter frequency RO architecture due to the larger VCO period:

$$\mathcal{L}_{TDC} = \frac{(2\pi)^2}{T_V^2} \left( \frac{t_{res}^2}{12} + \frac{\Delta_M^2}{3} + \frac{2}{\pi} \sigma_\tau^2 \right) \frac{1}{f_{REF}} \quad (15)$$

where $t_{res}$ and $T_V$ is the TDC delay and the VCO period, and $\Delta M$ correspond to the average mismatch. Here the mismatch is assumed as uniformly distributed. And for the embedded TDC, the jitter on the TDC edges follows the Gaussian distribution of the ring oscillator output. Since the delay, jitter and average mismatch are not correlated, the actual TDC noise floor with and without quarter frequency multiplication are shown in FIG. 5A, assuming a 10 ps rms jitter for the RO at 2.4 GHz. And after frequency multiplication, the in-band PN at 2.4 GHz output is slightly improved. The DAC resolution is restricted by the modulation, thus, the DAC noise floor is pretty low. And because of the divider-less nature of this design, the reference noise won't be up-converted as a problem.

The edge combiner, due to loading mismatch, will add a certain delay 'D' for each path. Thus the variance of the timing uncertainty from one path is:

$$\sigma_{\tau_{EC}} = \frac{(D)^2}{12} \quad (16)$$

In the worst case, there will be 3 phases with positive delay and 1 phase with negative delay, or vice versa. Thus the worst case delay is 3D in (16). The phase uncertainty is:

$$\sigma_{\phi_{EC}} = \frac{2\pi \sigma_{\tau_{EC}}}{T_v} \quad (17)$$

So the worst case phase noise introduced by the EC is:

$$\mathcal{L}_{EC} = \frac{(2\pi)^2}{12} \frac{(3D)^2}{T_v^2} \frac{1}{f_V} \quad (18)$$

It shows that the EC will add an extra non-filtered noise floor in the overall PN output due to the path delay from layout mismatch. But in practice its level is relatively low compared to other noise sources unless the farout PN is of concern.

Figure 5B:
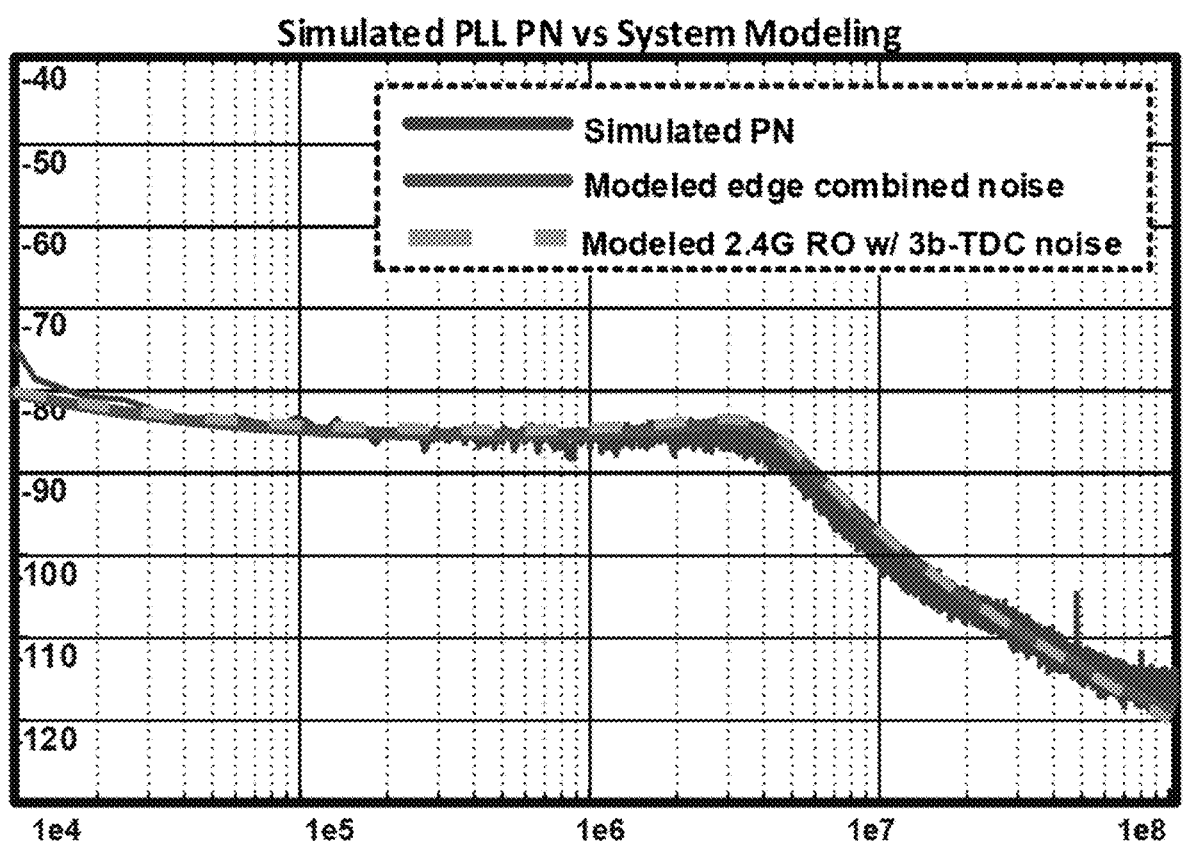
FIG. 5B is a graph showing simulated vs modeled noise performance of the proposed ADPLL.
Figure 5C:
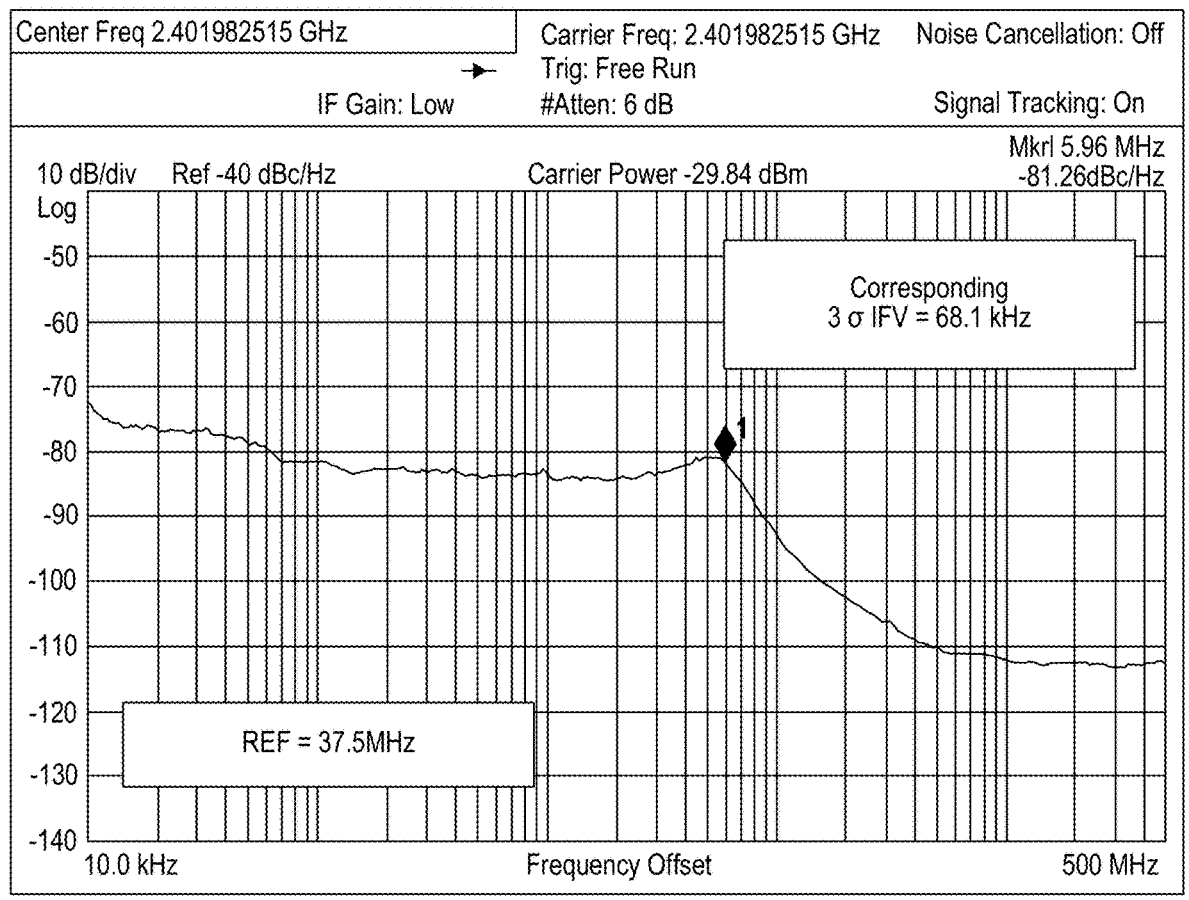
FIG. 5C is a graph showing measured phase noise with corresponding IFV for the proposed ADPLL.

Monte Carlo simulations for the EC show that the average delay offset is around 1.5 ps, and 1.7 ps calculated from indirect open loop PN measurement, which translates into a worst case noise floor of around −130 dBc/Hz. Thus the EC noise basically doesn't contribute to the in-band PN. From a time domain perspective, the EC-introduced jitter is much smaller than, and not correlated with, the random jitter from the high-PN RO. The windowed EC won't affect the overall RF performance in the random noise region. FIG. 5B shows the simulated PLL noise performance versus the model from the above analysis and FIG. 5C shows the measured PN of the proposed ADPLL. The phase noise performance corresponds to a 68.1 kHz $3\sigma_f$ IFV, which is close to the target design. The spur level is equal to 20 log ($\Delta t/T_V$), so it can be estimated that the typical spur level is <−50 dBc according to simulation. With this $f_{RF}/4$ RO and edge combiner architecture as well as the 5 b embedded TDC, the PLL controller's power consumption is 253 µW in a 40 nm technology.

Figure 6:
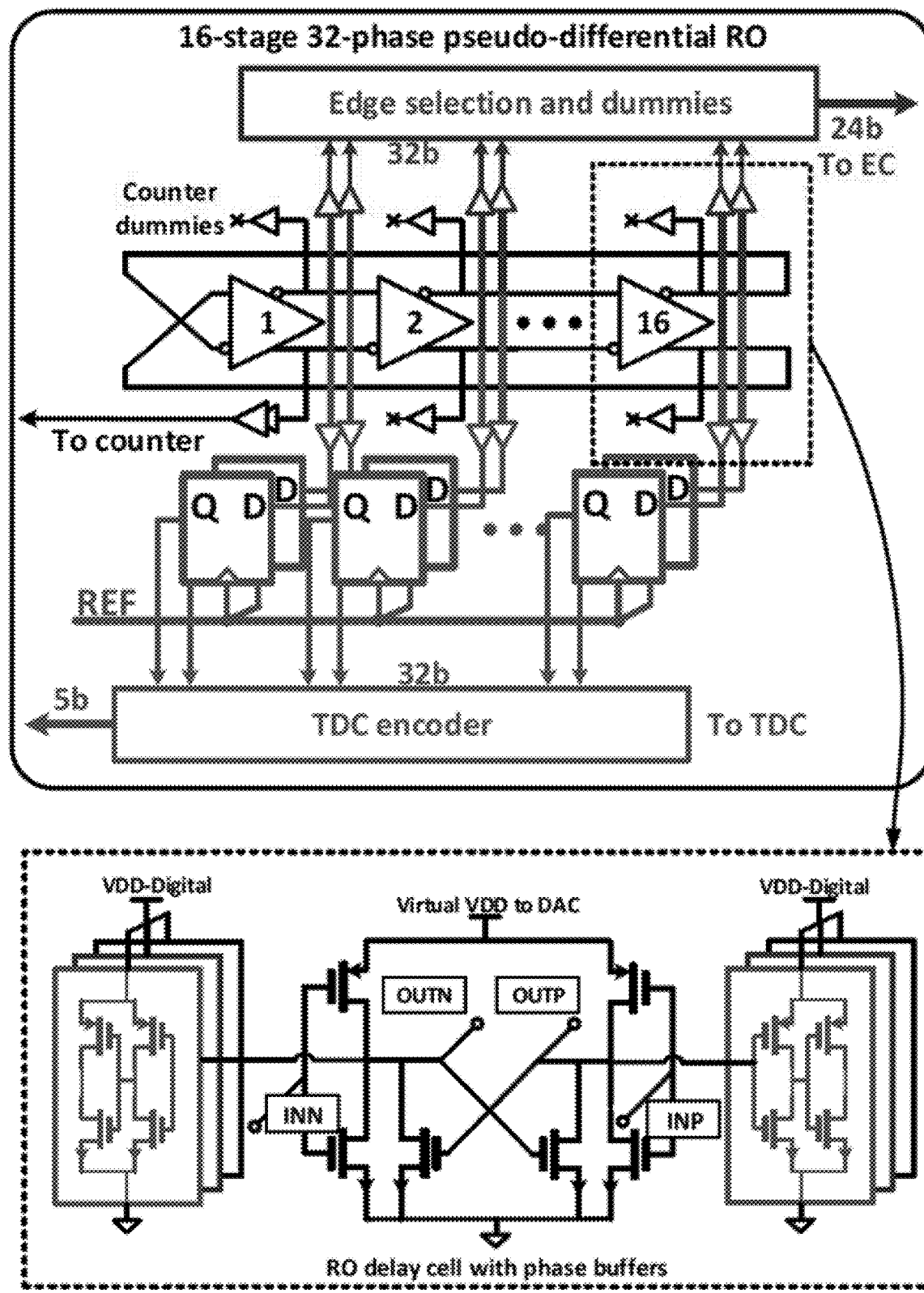
FIG. 6 is a schematic of an example 16-stage pseudo-differential ring oscillator block and the RO delay cell with buffers.

Further details regarding the example implementation are set forth below. First, a detailed circuit design for the co-designed 16-stage pseudo-differential ring oscillator 44 with the embedded TDC 45 and the edge selector for the edge combiner 33 is shown in FIG. 6. All the 32 phases of the ring oscillator are buffered out and directly sampled by 32 D flip-flops. Then the 32 b outputs are encoded in a TDC encoder to form a 5b TDC as a fractional phase error sampler. One phase output is sent to the counter for integer phase error calculation, while the rest phases are connected to dummies for a balanced output to minimize the TDC DNL. On the other hand, all phases are also buffered out to an edge selection circuit, where 24 of them are arranged and fed to the edge combiner while the other 8 phases are connected to dummies for phase balance as well. To perform the 4× frequency multiplication through the edge combiner, 8 of the 24 phases are arranged as the input signal of the edge combiner while the other 16 phases are used to form 4 windows as the control signal of the edge combiner. The ring oscillator cell is implemented with 2 inverter stages for each cell and NMOS-only cross couple pairs rather than cross coupled inverters for minimized loading. And each cell has 6 buffered outputs for TDC, EC and counter (or dummies). This helps achieve the best balance among speed, phase noise and power efficiency for the ring oscillator.

Figure 7:
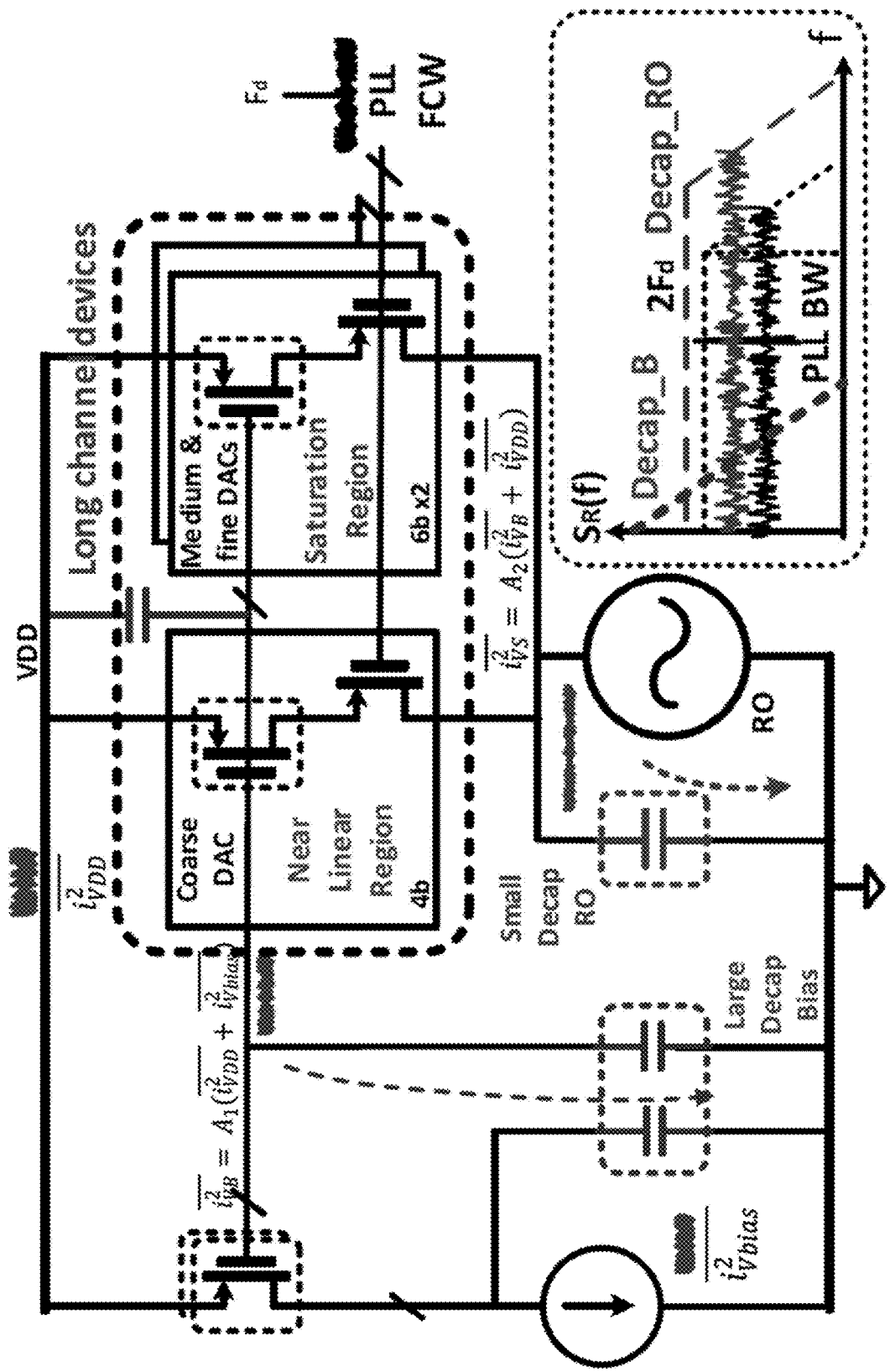
FIG. 7 is a schematic of an example current steering DAC for RO tuning and its major noise contributions.

Next, a current steering DAC 43 for digital ring oscillator tuning is shown in FIG. 7. The DAC is one of the most important circuit blocks for the PLL noise performance since supply and bias noise are critical to ring oscillator based designs. The coarse DAC is 4b binary weighted and can cover up to 300 MHz, which tunes the oscillator from 400 MHz to 700 MHz. The medium and fine current steering DACs are 6b each that covers 70 MHz range with approximately 20 kHz LSB tuning step for the RO to keep a low DAC noise floor in the PLL. Since the PLL BW is very large for in-band phase noise suppression and direct reference phase modulation, the decap on the virtual VDD of the RO has to be fairly small to keep the PLL loop stable, thus plenty of noise from the supply and the bias network will pass through. To deal with this, the coarse DAC bank is designed at the edge of the triode region to minimize the noise gain since the coarse DAC has the highest current ratio and dominates the noise performance. Coarse tuning linearity and tuning range of the RO will be sacrificed for noise performance. The medium and fine DAC banks are designed in the saturation region to keep the required tuning linearity while the PLL is locked. Additional large on chip decaps are added to the gate of the DAC cells to filter the accumulated supply and bias noise.

Figure 8:
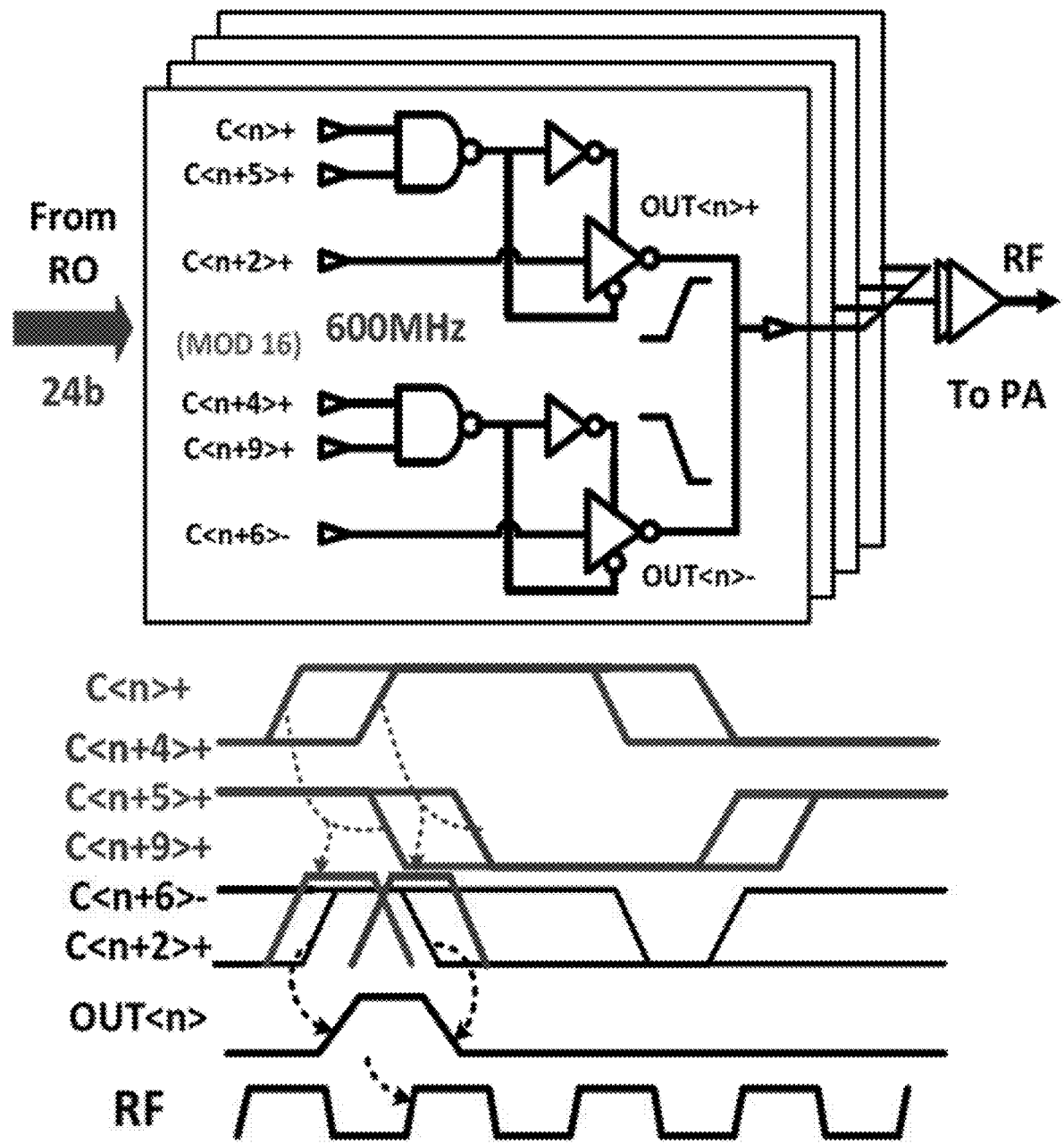
FIG. 8 is a schematic of an example edge combiner block and its working principle.

FIG. 8 shows an example embodiment of the windowed edge combiner 33. In the 24 phases of the ring oscillator input, 6 phases are used for each rising and falling edge to be combined, in which the 2 windows are spaced by 4 ring oscilaltor delays and the window width is 5 delays to ensure all selected phases pass through in different PVT corners. Tristate gates are used to pass the selected phase and buffer the interference from other phases. The timing diagram for edge combining is shown in FIG. 8. In this design, the edge combiner consumes just 20 µW from simulation and its added jitter is much smaller than the RO jitter itself, keeping the RF output in the random noise region. In applications where the edge combiner jitter is comparable to the oscillator jitter, then it cannot be treated as working in the random noise region for frequency multiplication. Power has to be traded off for mismatch in the edge combiner circuit design according to system requirement.

Figure 9:
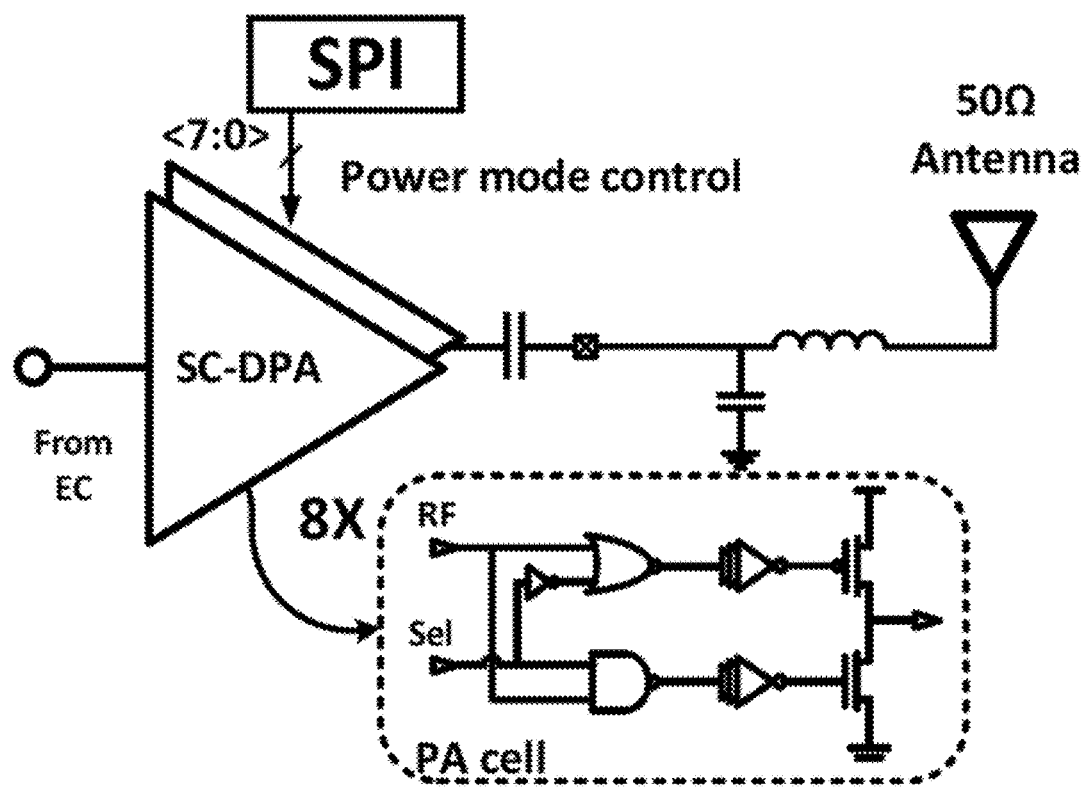
FIG. 9 is a schematic of an example programmable switch-capacitor digital power amplifier.

The power amplifier 36 is a switch-capacitor digital PA. The efficiency of this kind of PA is related to the ratio of the loading impedance and on resistance of the driving transistor minus the power of the harmonics. Higher loading impedance helps with efficiency but at the cost of lower output power level. As shown in FIG. 9, the SCDPA is thermometer coded with 8-bit cells and is matched and optimized for the highest efficiency for −10 dBm operation, which is sufficient for 2-3 meters short range communication.

Figure 10:
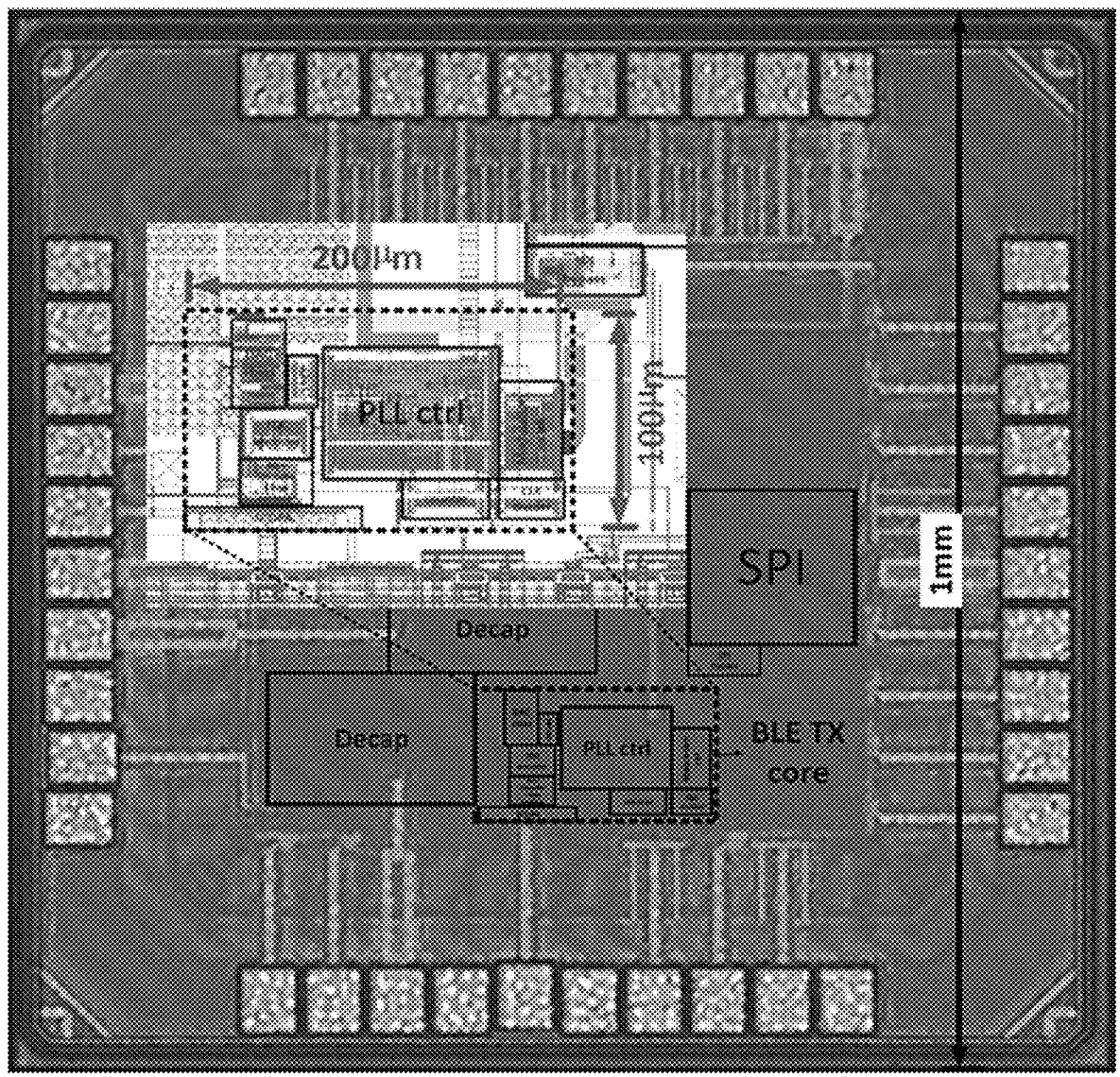
FIG. 10 shows a die photo of the proposed BLE transmitter.
Figure 11A:
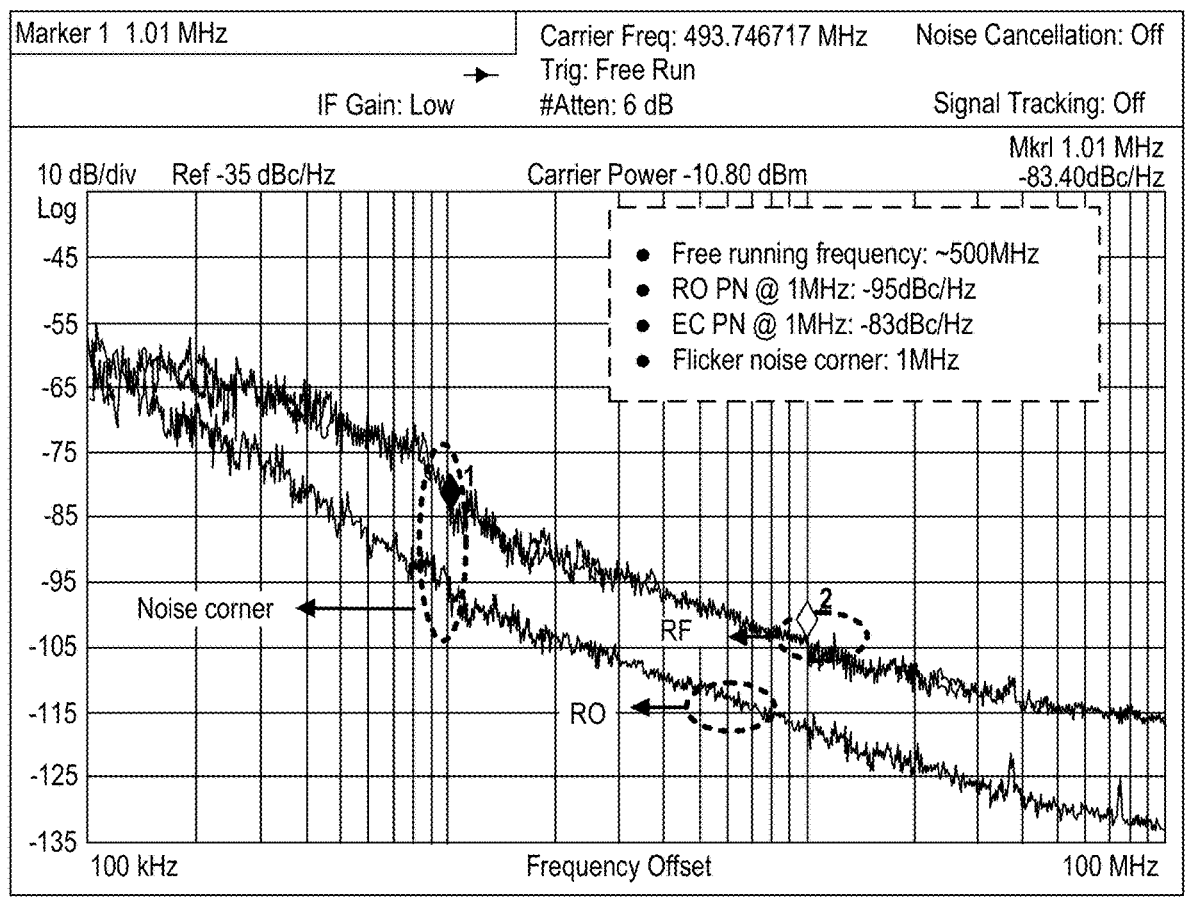
FIG. 11A is a graph showing the measured phase noise comparison between a free running ring oscillator vs the RF output.
Figure 11B:
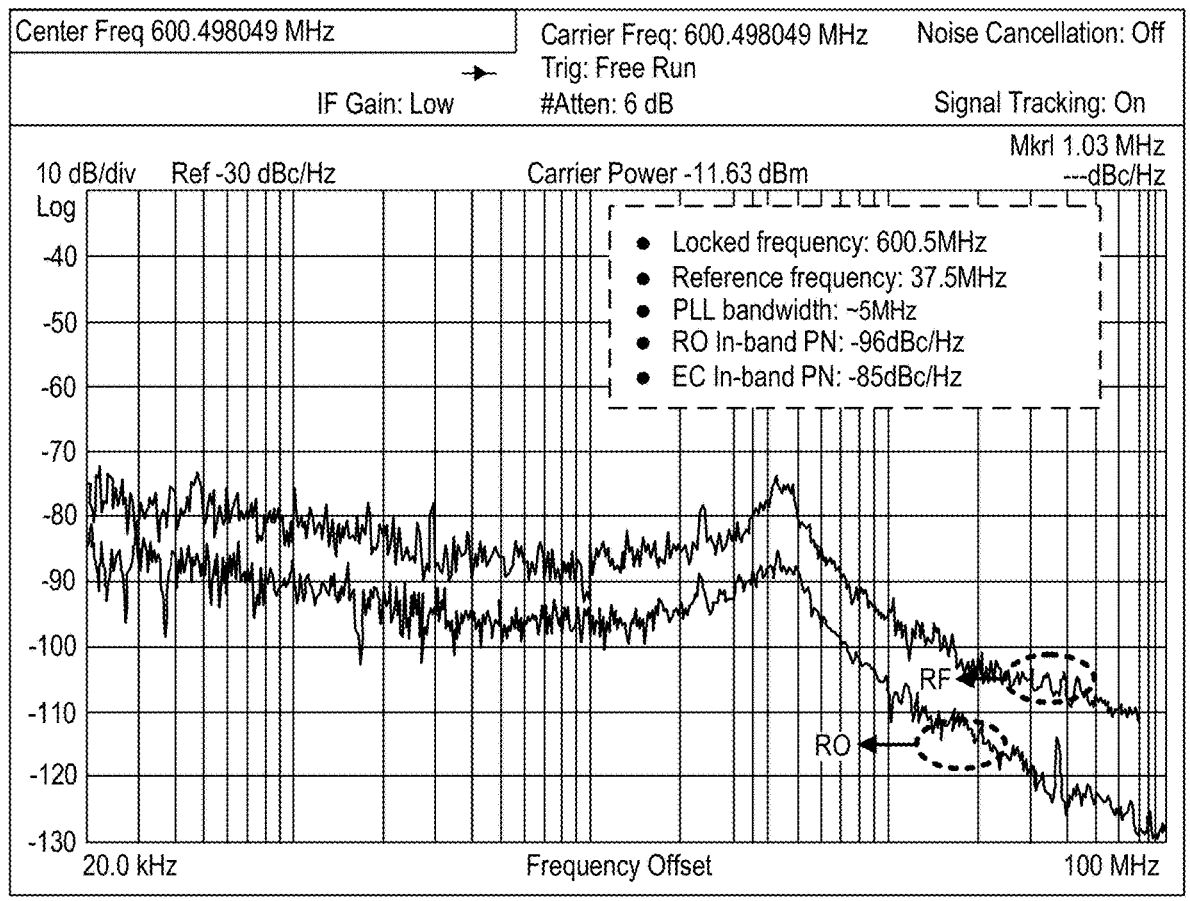
FIG. 11B is a graph showing measured phase noise comparison between a closed loop ring oscillator vs the RF output.

The frequency synthesizer with the proposed ADPLL described above is particularly suited for a BLE transmitter. As a proof of concept, a BLE transmitter was fabricated in 40 nm CMOS and the die photo of the prototype chip is shown in FIG. 10. The core area of the transmitter is 0.0166 mm2. The measurement results are shown as follows. FIG. 11A shows the measurement of the open loop and closed loop. FIG. 11B shows phase noise performance of the proposed ADPLL. When the RO is free running at 494 MHz, the PN @ 1 MHz offset is −95 dBc/Hz and the EC output at around 2 GHz is −83 dBc/Hz, with the noise corner both at around 1 MHz. The PN of the ADPLL is shown in FIG. 11B. It's locked at 600.5 MHz with a 37.5 MHz reference. The PLL bandwidth is around 5 MHz and the measured in-band PN of the oscillator and the EC output at 2.402 GHz are −96 dBc/Hz and −85 dBc/Hz, respectively.

Figure 12:
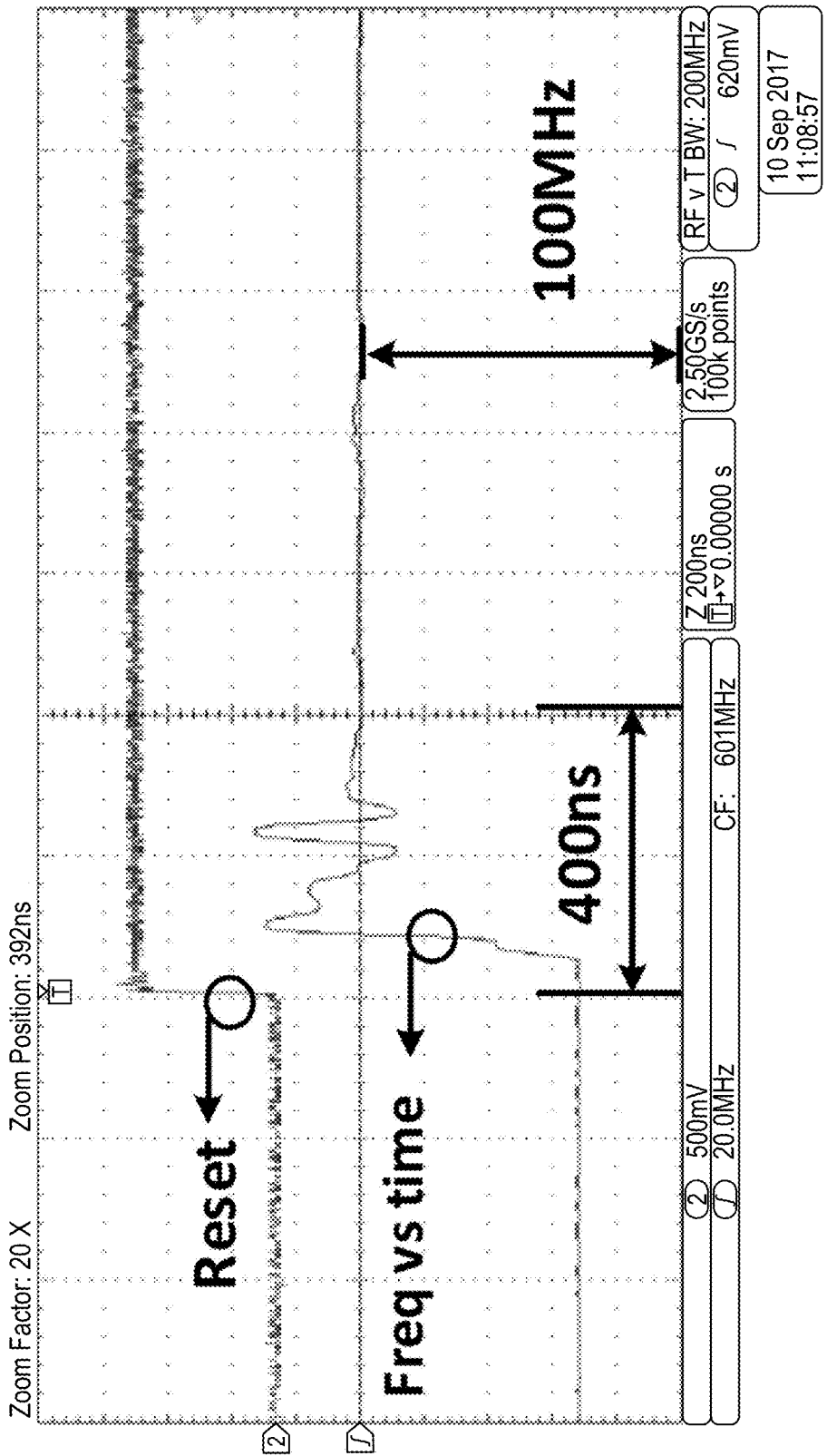
FIG. 12 is a graph showing a PLL transient measurement.

The PLL locking transient is shown in FIG. 12. As can be seen from the frequency vs time diagram, due to the large bandwidth, the PLL locks within 400 ns after reset from a 70 MHz initial frequency offset.

Figure 13:
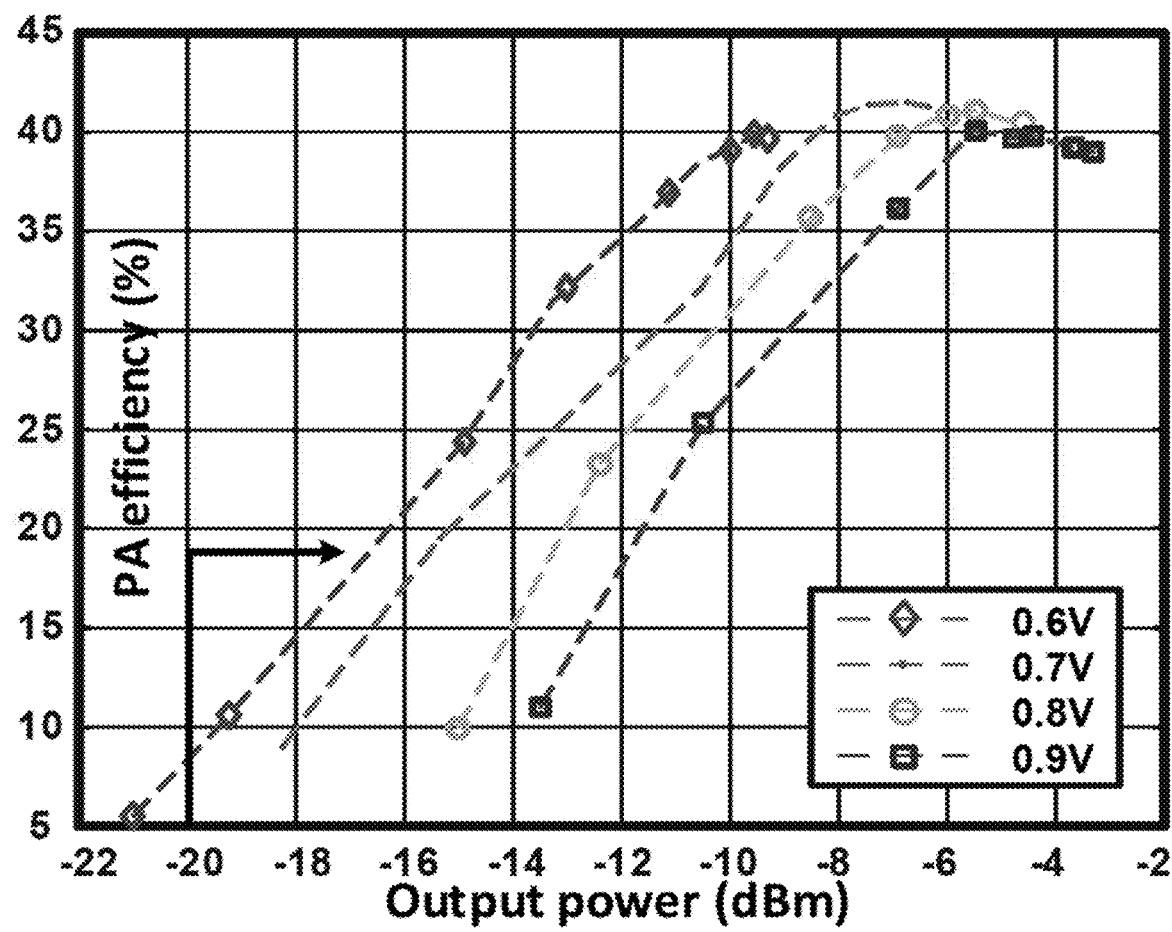
FIG. 13 is a graph showing PA efficiency versus output power with different power supplies.
Figure 15:
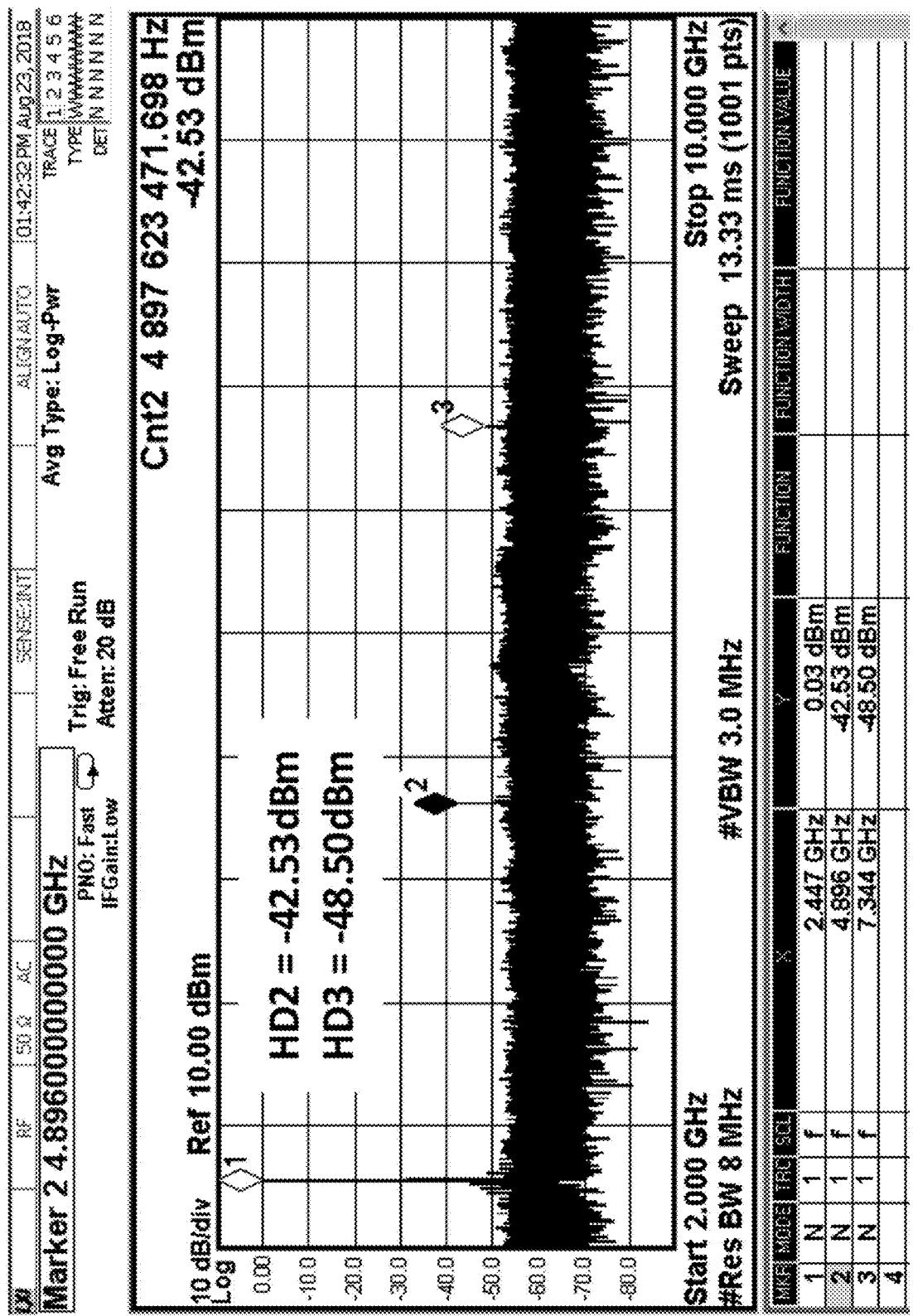
FIG. 15 is a graph showing transmitter harmonic measurement with external matching network.

FIG. 13 shows the SCDPA measurement showing the PA efficiency vs output power at different supply voltages. Using a 0.6V power supply, the PA consumes 107 µW with a −19.2 dBm output power, yielding a 10.8% PA efficiency at the lower boundary of the BLE output power requirement. In its highpower mode with a 0.9V supply, it can deliver −3.3 dBm while consuming 1.2 mW with a 39% efficiency. The maximum efficiency of 41% is achieved at around −8 dBm (@0.7V) output power. Due to the non-linear nature of the SCDPA, an external matching network is used to suppress TX harmonic emissions. And the measured harmonic performance is shown in FIG. 15. With the off chip matching network, both HD2 and HD3 are smaller than −42 dBm with a 1.2V PA power supply, which complies with BLE requirements.

Figure 14A:
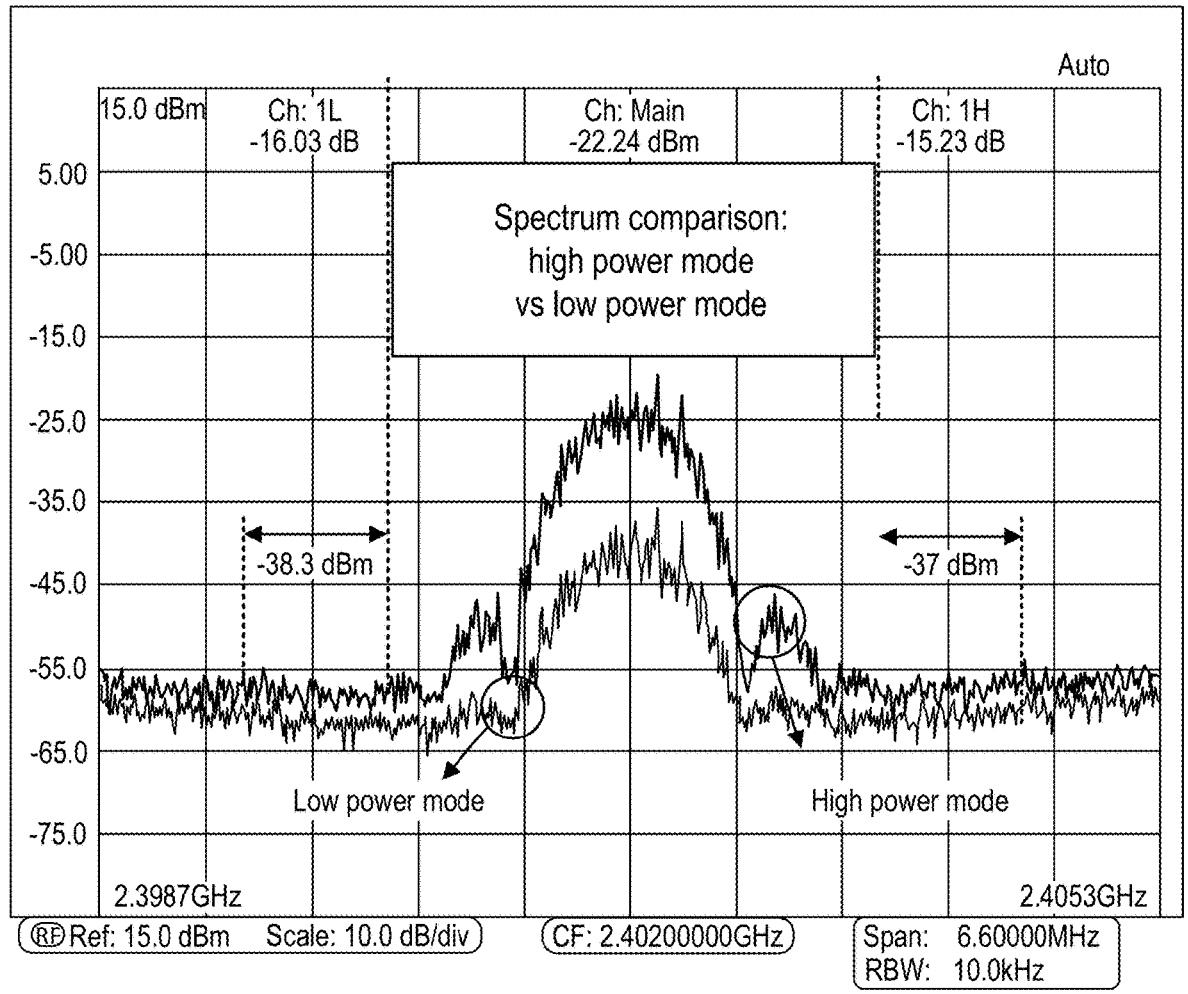
FIG. 14A is a graph showing output spectrum of the transmitter in low-power and high-power mode.
Figure 14B:
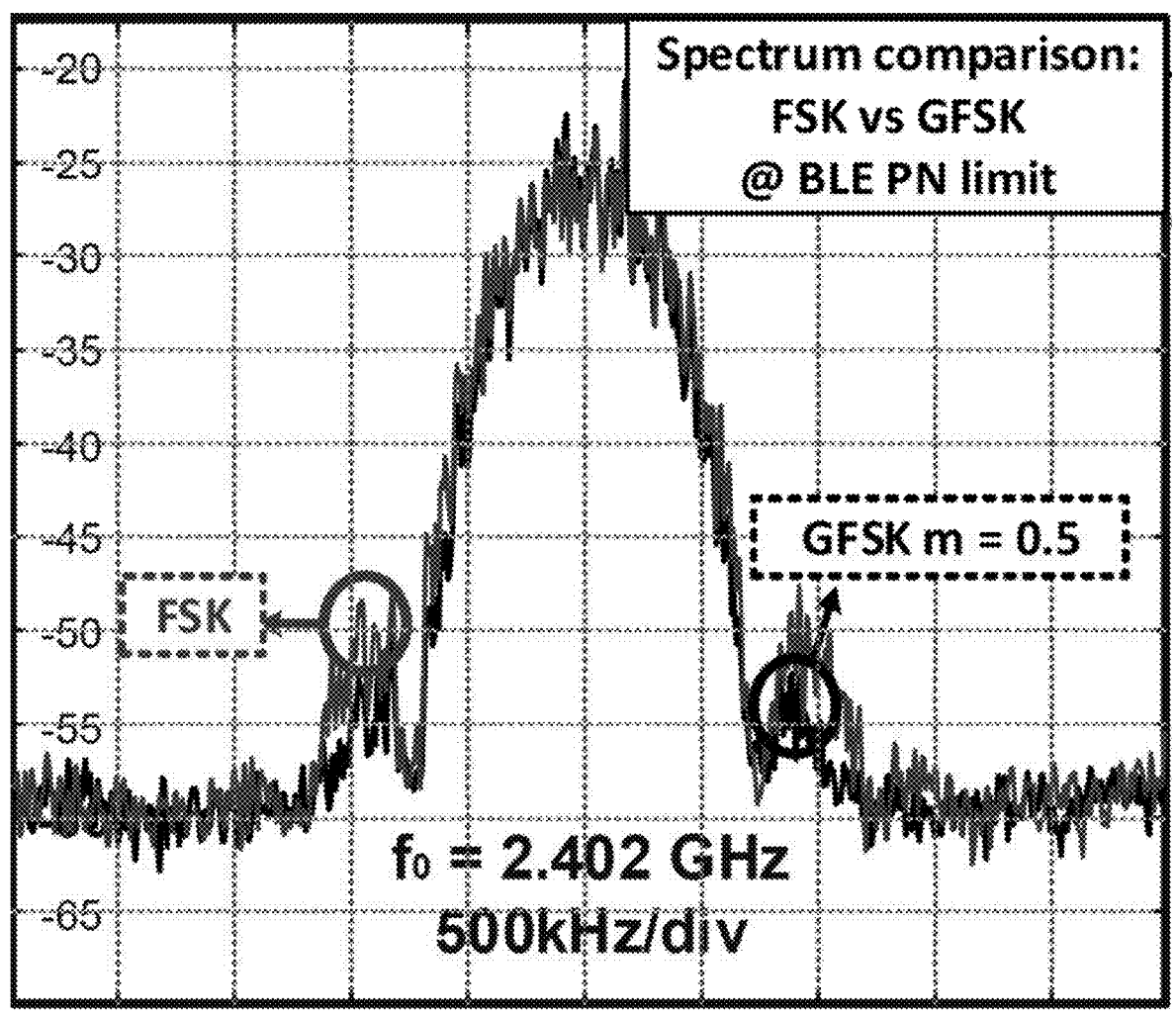
FIG. 14B is a graph showing a spectrum comparison of FSK and GFSK in the PN limit region for the transmitter.
Figure 14C:
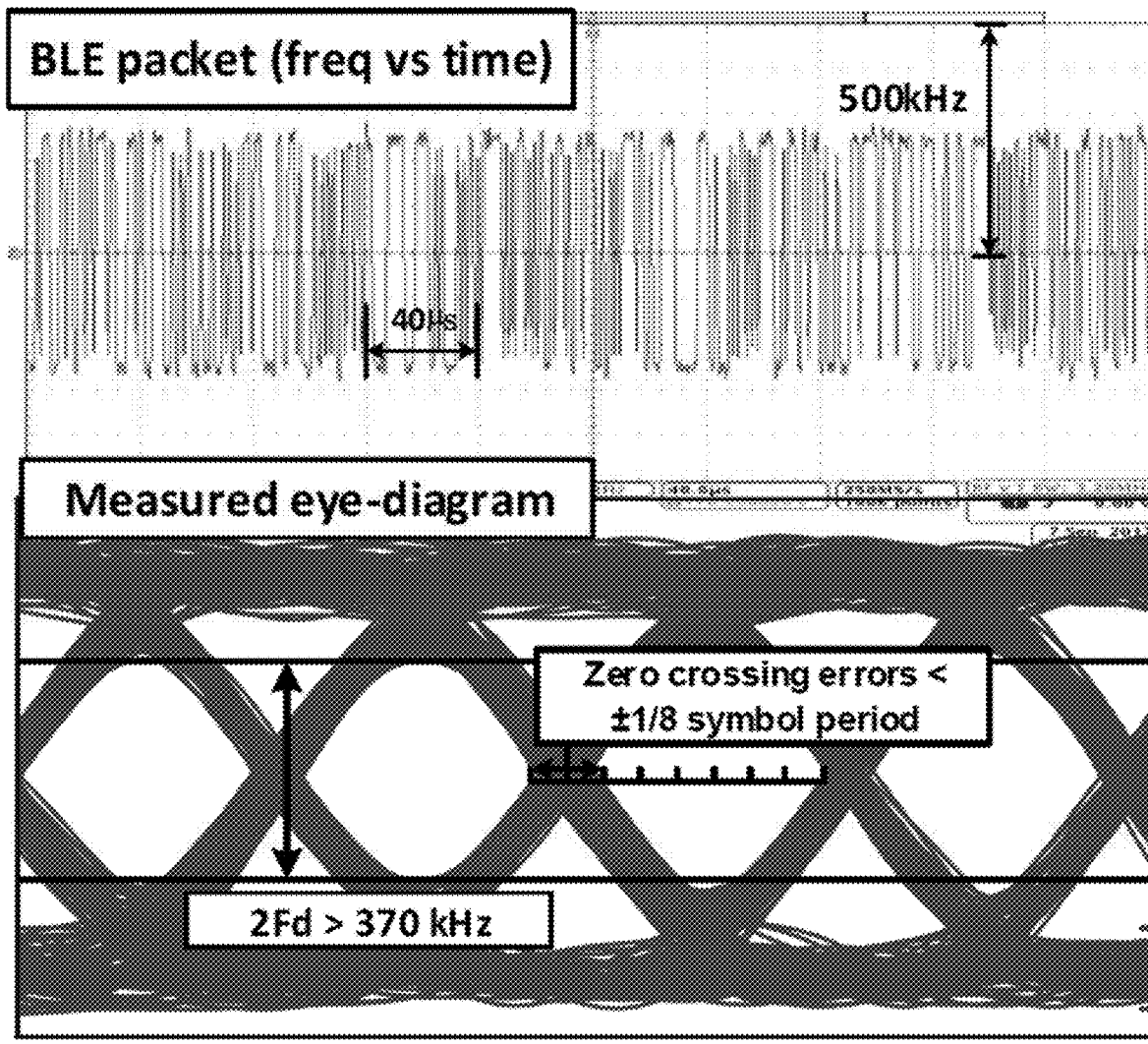
FIG. 14C is a graph showing captured BLE packets and an eye diagram for the transmitter.

The transmitter spectrum is measured while transmitting a repeated BLE packet, which meets the BLE spectrum mask requirement in both high power and low power modes using a 0.6V supply, as shown in FIG. 14A. A comparison of FSK and GFSK at the PN limit region is shown in FIG. 14B, showing that when operating at the PN limit region, FSK and GFSK basically have the same spectrum efficiency. This simplification in modulation could potentially help reduce the power consumption even more for applications such as self-powered sensors with power consumption as the primary concern. The measured frequency vs. time for part of the BLE packets are also shown. The eye-diagram is calculated from the captured frequency domain signal. The phase noise from the RO-based design does degrade the eye performance, but as designed, both the symbol timing and 3σ IFV barely meet the BLE communication limit. The FSK error is 9.1% for this design, which can be expected from the 68 kHz frequency variation.

Figure 16:
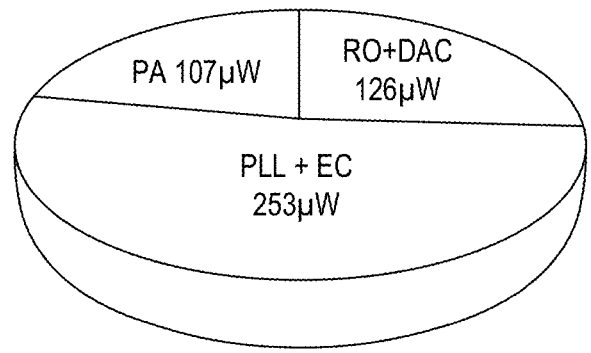
FIG. 16 are charts showing a transmitter power breakdown in low-power and high-power mode.
Figure 16:
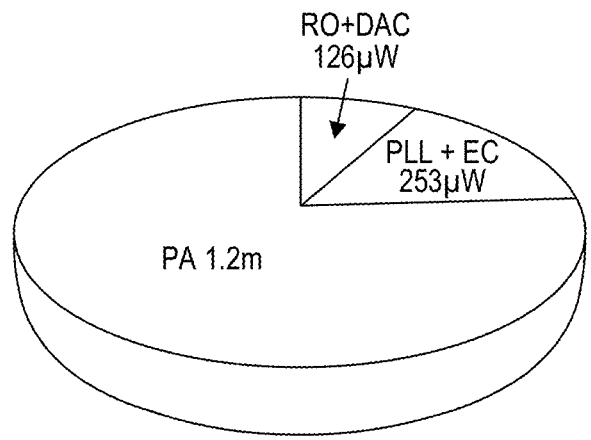

The power breakdown is shown in FIG. 16. While working at the low power mode with a 37.5 MHz off chip reference, the RO with the DAC bias network consumes 126 µW, the PA consumes 107 µW and the PLL blocks with the edge combiner consumes 253 µW. In high power mode, the PA consumes 1.2 mW. The all-digital RO based BLE TX consumes a total 486 µW and 1.6 mW in low-power and high-power mode.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:
1. A frequency synthesizer, comprising:
a modulation controller configured to receive a reference signal from a reference source and operates to frequency modulate the reference signal in accordance with a frequency control word;

a phase-locked loop circuit interfaced with the modulation controller to receive a frequency modulated input signal, wherein the phase-locked loop circuit includes a ring oscillator with an embedded time-to-digital converter circuit; and a frequency multiplier circuit configured to receive a frequency modulated output signal from the phase-locked loop circuit and increase frequency of the frequency modulated output signal by a multiplier.

2. The frequency synthesizer of claim 1 wherein the frequency multiplier circuit is further defined as a windowed edge combiner.

3. The frequency synthesizer of claim 2 wherein the time-to-digital converter circuit and the windowed edge combiner are configured to concurrently receive phases of the ring oscillator.

4. The frequency synthesizer of claim 1 wherein the time-to-digital converter circuit directly samples phases of the ring oscillator without delay lines.

5. The frequency synthesizer of claim 1 wherein the phase-locked loop circuit includes a digital-to-analog converter coupled to an input of the ring oscillator and operates to tune frequency of the ring oscillator.

6. The frequency synthesizer of claim 5 wherein the digital-to-analog converter includes a coarse tuning bank comprised of one or more transistors biased on in a linear region and a fine tuning bank comprised of one or more transistors only biased in a saturation region.

7. The frequency synthesizer of claim 1 wherein the ring oscillator is further defined as a pseudo-differential ring oscillator with at least 32 phases.

8. The frequency synthesizer of claim 1 wherein the modulation controller uses single-point modulation control to frequency modulate the carrier signal.

9. The frequency synthesizer of claim 1 bandwidth for the phase-locked loop circuit is programmable and larger than modulation bandwidth.

10. The frequency synthesizer of claim 1 integrated into a wireless transmitter.

11. An ultra-low power wireless transmitter, comprising:
an antenna;
a phase-locked loop circuit configured to receive a carrier signal from an oscillating source and operates to generate a frequency modulated output signal, wherein the phase-locked loop circuit includes a ring oscillator with an embedded time-to-digital converter circuit;

a controller interfaced with the phase-locked loop circuit and operates to frequency modulate the carrier signal in accordance with a frequency control word;

a frequency multiplier circuit configured to receive the frequency modulated output signal from the phase-locked loop circuit and increase frequency of the frequency modulated output signal by a multiplier; and a power amplifier electrically coupled between an output of the frequency multiplier circuit and the antenna.

12. The wireless transmitter of claim 11 wherein the phase-locked loop circuit exhibits less than 65 kilohertz of frequency deviation.

13. The wireless transmitter of claim 11 wherein the frequency multiplier circuit outputs a signal at 2.4 GHz and the phase-locked loop circuit has a bandwidth greater than 5 megahertz and operates with −85 dBc/Hz in-band phase noise.

14. The wireless transmitter of claim 11 wherein the frequency multiplier circuit is further defined as a windowed edge combiner.

15. The wireless transmitter of claim 11 wherein the time-to-converter circuit directly samples phase of the ring oscillator without delay lines.

16. The wireless transmitter of claim 11 wherein the phase-locked loop circuit includes a digital-to-analog converter coupled to an input of the ring oscillator and operates to tune frequency of the ring oscillator.

17. The wireless transmitter of claim 16 wherein the digital-to-analog converter includes a coarse tuning bank comprised of one or more transistors biased on in a linear region and a fine tuning bank comprised of one or more transistors only biased in a saturation region.

18. The wireless transmitter of claim 11 wherein the ring oscillator is further defined as a pseudo-differential ring oscillator with at least 32 phases.

19. The wireless transmitter of claim 11 wherein the modulation controller uses single-point modulation control to frequency modulate the carrier signal.

20. The wireless transmitter of claim 11 wherein the power amplifier is further defined as a switched-capacitor digital power amplifier.

* * * * *